US011032454B2

(12) United States Patent
Wang et al.

(10) Patent No.: US 11,032,454 B2
(45) Date of Patent: Jun. 8, 2021

(54) CIRCUIT BOARD, MOLDED PHOTOSENSITIVE ASSEMBLY AND MANUFACTURING METHOD THEREFOR, PHOTOGRAPHING MODULE, AND ELECTRONIC DEVICE

(71) Applicant: NINGBO SUNNY OPOTECH CO., LTD., Zhejiang (CN)

(72) Inventors: Mingzhu Wang, Ningbo (CN); Zhenyu Chen, Ningbo (CN); Duanliang Cheng, Ningbo (CN); Takehiko Tanaka, Nara (JP); Bojie Zhao, Ningbo (CN); Nan Guo, Ningbo (CN); Yafei Wang, Ningbo (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 4 days.

(21) Appl. No.: 16/472,032

(22) PCT Filed: Jan. 11, 2018

(86) PCT No.: PCT/CN2018/072198
§ 371 (c)(1),
(2) Date: Jun. 20, 2019

(87) PCT Pub. No.: WO2018/130172
PCT Pub. Date: Jul. 19, 2018

(65) Prior Publication Data
US 2020/0120244 A1    Apr. 16, 2020

(30) Foreign Application Priority Data

Jan. 11, 2017   (CN) .......................... 201710018364.6
Jan. 11, 2017   (CN) .......................... 201720028251.X
Jan. 11, 2017   (CN) .......................... 201720028945.3

(51) Int. Cl.
*H04N 5/225* (2006.01)
*H01L 27/146* (2006.01)
(Continued)

(52) U.S. Cl.
CPC ......... *H04N 5/2254* (2013.01); *H01L 23/552* (2013.01); *H01L 27/14618* (2013.01);
(Continued)

(58) Field of Classification Search
None
See application file for complete search history.

(56) References Cited

U.S. PATENT DOCUMENTS 5,153,379 A   10/1992   Guzuk et al.
5,412,340 A   5/1995   Tanikoshi
(Continued)

FOREIGN PATENT DOCUMENTS

CN   1242138 A     1/2000
CN   104838737 A   8/2015
(Continued)

OTHER PUBLICATIONS

International Search Report for PCT/CN2018/072198 dated Apr. 11, 2018 [PCT/ISA/210].

*Primary Examiner* — Mark T Monk
(74) *Attorney, Agent, or Firm* — Sughrue Mion, PLLC

(57) ABSTRACT

The present invention provides a circuit board, a molded photosensitive assembly and manufacturing method therefor, a photographing module, and an electronic device. The circuit board comprises a substrate and at least one circuit portion formed on the substrate. A photosensitive element and the circuit portion are conductively connected. The circuit portion forms a ring circuit in an edge region of the substrate. The ring circuit surrounds the photosensitive (Continued)

element, so that in a molding process, the photosensitive element can be protected by the ring circuit.

19 Claims, 23 Drawing Sheets

(51) Int. Cl.
    *H01L 23/58*     (2006.01)
    *H01L 23/552*     (2006.01)
    *G02B 7/04*     (2021.01)
    *H01L 23/00*     (2006.01)

(52) U.S. Cl.
    CPC .......... *H01L 27/14636* (2013.01); *G02B 7/04* (2013.01); *H01L 23/585* (2013.01); *H01L 24/48* (2013.01); *H01L 2224/48091* (2013.01); *H01L 2224/48106* (2013.01); *H01L 2224/48227* (2013.01)

(56) References Cited

U.S. PATENT DOCUMENTS

| | | | | |
|---|---|---|---|---|
| 2005/0263312 | A1* | 12/2005 | Bolken | H01L 23/49861 174/559 |
| 2011/0130177 | A1* | 6/2011 | Halliday | H04N 5/2257 455/575.1 |
| 2015/0138436 | A1* | 5/2015 | Wong | H01L 27/14683 348/374 |

FOREIGN PATENT DOCUMENTS

| | | |
|---|---|---|
| CN | 105681637 A | 6/2016 |
| CN | 106057831 A | 10/2016 |
| JP | 7-99214 A | 4/1995 |

* cited by examiner

CIRCUIT BOARD, MOLDED PHOTOSENSITIVE ASSEMBLY AND MANUFACTURING METHOD THEREFOR, PHOTOGRAPHING MODULE, AND ELECTRONIC DEVICE

CROSS REFERENCE TO RELATED APPLICATIONS

This application is a National Stage of International Application No. PCT/CN2018/072198 filed Jan. 11, 2018, claims priorities and rights to Chinese Patent Application No. 201710018364.6, Chinese Patent Application No. 201720028945.3, and Chinese Patent Application No. 201720028251.X, filed with the China National Intellectual Property Administration (CNIPA) on Jan. 11, 2017, the disclosures of which are hereby incorporated by reference in their entireties.

TECHNICAL FIELD

The present disclosure relates to the field of optical imaging, and specifically to a circuit board and a molded photosensitive assembly and manufacturing methods thereof, a camera module, and an electronic device.

BACKGROUND

In recent years, electronic products and intelligent devices have been increasingly developed toward thinness and high performance, which poses more stringent requirements for the size and imaging quality of camera modules as one of the standard configurations of the electronic products and the intelligent devices.

In order to reduce the size of the camera module and improve the imaging quality of the camera module, the camera module is configured with a photosensitive element having a larger photosensitive area and more larger passive electronic components, and the change in packaging of the camera module is also increasingly important. In a conventional camera module, a chip and each electronic component manufactured separately are respectively mounted on a circuit board by using a COB (Chip On Board) packaging process, a lens holder is mounted on the circuit board by means of glue, a filter is mounted on the lens holder, and then a lens barrel or a motor assembled with an optical lens is mounted on the lens holder, so that the optical lens is held on a photosensitive path of the chip, where such a packaging method leads to a large size and a low yield of the camera module. In order to overcome the above problems, a molding process is now introduced in the packaging process of the camera module. Specifically, after the chip and each electronic component are respectively mounted on the circuit board, the circuit board is placed in a molding die, the pressing surface of the molding die is pressed against the surface of the circuit board, and then a fluid molding material is added and consolidated to form a base integrated with the circuit board. The camera module manufactured by the molding process has many advantages such as small size, short process and high yield, so that the molding process becomes a most important process in packaging of the camera module. Despite this, the conventional molding process has many defects.

FIG. 1 shows a circuit board of a camera module, where the circuit board is formed by plating or printing on a surface of a substrate, which causes circuits to protrude from the surface of the substrate. Since the molded lens holder is mounted on the circuit board by means of glue in the COB packaging process, the flatness of the circuit board is not the focus of the conventional COB packaging process. However, in the molding process, the pressing surface of the molding die is pressed directly against the surface of the circuit board, and the circuits protrude from the surface of the substrate, so that many slits are formed between the pressing surface of the molding die and the surface of the substrate. When the fluid molding material is added to the molding die, the fluid molding material easily enters the middle portion of the circuit board from the outer portion of the circuit board through the slits to contaminate photosensitive element, resulting in a decline in yield of the camera module.

SUMMARY

An objective of the present disclosure is to provide a circuit board and a molded photosensitive assembly and manufacturing methods thereof, a camera module, and an electronic device. The circuit board includes a substrate and at least one circuit section, the circuit section forms a ring circuit in an edge region of the substrate, and the ring circuit surrounds a photosensitive element to protect the photosensitive element.

An objective of the present disclosure is to provide a circuit board and a molded photosensitive assembly and manufacturing methods thereof, a camera module, and an electronic device. During a molding process, the ring circuit prevents a fluid molding material from flowing from the edge region of the substrate to a region where the photosensitive element is located, thereby preventing the molding material from contaminating the photosensitive element due to the entry into the region where the photosensitive element is located to avoid undesirable phenomena such as stain spots.

An objective of the present disclosure is to provide a circuit board and a molded photosensitive assembly and manufacturing methods thereof, a camera module, and an electronic device. The ring circuit prevents the molding material from contacting the photosensitive element to avoid an undesirable phenomenon of thermal deformation of the photosensitive element due to the fact that the molding material at a high temperature transfers the heat to the photosensitive element.

An objective of the present disclosure is to provide a circuit board and a molded photosensitive assembly and manufacturing methods thereof, a camera module, and an electronic device. The ring circuit is away from the photosensitive element, that is, a safety distance is reserved between the ring circuit and the photosensitive element, and in this way, the molding material at a high temperature is further prevented from transferring the heat to the photosensitive element.

An objective of the present disclosure is to provide a circuit board and a molded photosensitive assembly and manufacturing methods thereof, a camera module, and an electronic device. During the molding process, a pressing face of a molding die is pressed against the ring circuit to prevent the molding material from flowing from the edge region of the substrate to the region where the photosensitive element is located through the ring circuit and the pressing surface of the molding die.

An objective of the present disclosure is to provide a circuit board and a molded photosensitive assembly and manufacturing methods thereof, a camera module, and an electronic device. The ring circuit may form a complete ring, so that when the pressing surface of the molding die is pressed against the ring circuit, a gap is prevented from being formed between the ring circuit and the pressing surface of the molding die.

An objective of the present disclosure is to provide a circuit board and a molded photosensitive assembly and manufacturing methods thereof, a camera module, and an electronic device. The ring circuit includes at least one first circuit unit and at least one second circuit unit, the first circuit unit extends annularly around the photosensitive element but is not closed, and the second circuit unit is disposed at an unclosed position of the first circuit unit, such that the second circuit unit increases the resistance to the molding material at the unclosed position of the first circuit unit, and the molding material is then prevented from entering the region where the photosensitive element is located from the edge region of the substrate.

An objective of the present disclosure is to provide a circuit board and a molded photosensitive assembly and manufacturing methods thereof, a camera module, and an electronic device. When the molding material enters the unclosed position of the first circuit unit, the second circuit unit is capable of rapidly decreasing the flow capacity of the molding material at the unclosed position.

An objective of the present disclosure is to provide a circuit board and a molded photosensitive assembly and manufacturing methods thereof, a camera module, and an electronic device. The second circuit unit is disposed in a sector shape at the unclosed position of the first circuit unit to change the flow direction of the molding material at the unclosed position, so that the oblique flow direction of the molding material limits the vertical flow distance of the molding material.

An objective of the present disclosure is to provide a circuit board and a molded photosensitive assembly and manufacturing methods thereof, a camera module, and an electronic device. At least one slit is formed between the first circuit unit and the second circuit unit, and the slit is elongated, thus preventing the molding material from entering the region where the photosensitive element is located from the edge region of the substrate via the slit.

An objective of the present disclosure is to provide a circuit board and a molded photosensitive assembly and manufacturing methods thereof, a camera module, and an electronic device. At least one of the first circuit unit or the second circuit unit may form at least one blocking protrusion, and the blocking protrusion extends into the slit to reduce a size of the slit, thereby preventing the molding material from entering the region where the photosensitive element is located from the edge region of the substrate via the slit.

An objective of the present disclosure is to provide a circuit board and a molded photosensitive assembly and manufacturing methods thereof, a camera module, and an electronic device. Apart of the first circuit unit or the second circuit unit is widened along the edge of the molding die to form the blocking protrusion, thereby increasing the resistance to the molding material flowing from the edge region of the substrate to the region where the photosensitive element is located. At the same time, the molding material is also confined in the smaller slit, thereby reducing the distance and amount of the molding material entering the slit to prevent the molding material from entering the region where the photosensitive element is located.

An objective of the present disclosure is to provide a circuit board and a molded photosensitive assembly and manufacturing methods thereof, a camera module, and an electronic device. The circuit board includes at least one set of circuit board connectors, and the circuit board connectors may be electrically connected to the ring circuit nearby, thereby saving the wiring cost and ensuring the reliability during signal transmission.

An objective of the present disclosure is to provide a circuit board and a molded photosensitive assembly and manufacturing methods thereof, a camera module, and an electronic device. An opening of the slit facing the edge region of the substrate corresponds to the circuit board connector, such that the circuit board connector prevents the molding material from directly entering the slit.

An objective of the present disclosure is to provide a circuit board and a molded photosensitive assembly and manufacturing methods thereof, a camera module, and an electronic device. The circuit board connectors may be electrically connected to the ring circuit nearby, so that signals are transmitted more quickly, and the response speed of the camera module is improved.

An objective of the present disclosure is to provide a circuit board and a molded photosensitive assembly and manufacturing methods thereof, a camera module, and an electronic device. The ring circuit surrounds the photosensitive element, so that the photosensitive element is in an electromagnetic field enclosed environment and is prevented from the interference of outside electromagnetic waves, and the interference of electromagnetic waves generated by the photosensitive element to the outside is reduced, that is, the ring circuit can form an electromagnetic field shielding portion to ensure the reliability of the camera module during imaging.

According to an aspect of the present disclosure, the present disclosure provides a circuit board, at least one photosensitive element is conductively connected to the circuit board, and the circuit board includes: a substrate, the substrate having an edge region; and at least one circuit section, where the circuit section is formed on the substrate, the photosensitive element and the circuit section are conductively connected, the circuit section forms a ring circuit in the edge region of the substrate, and the ring circuit surrounds the photosensitive element.

According to an embodiment of the present disclosure, the substrate has at least one chip mounting region, the edge region and the chip mounting region are integrally formed, and the photosensitive element is mounted to the chip mounting region such that the ring circuit surrounds the photosensitive element.

According to an embodiment of the present disclosure, the substrate has at least one receiving space, the edge region surrounds the receiving space, and the photosensitive element is received in the receiving space such that the ring circuit surrounds the photosensitive element.

According to an embodiment of the present disclosure, the edge region of the substrate has a substrate inner portion and a substrate outer portion, and the substrate inner portion and the substrate outer portion are respectively located inside and outside the ring circuit.

According to an embodiment of the present disclosure, the circuit board further includes at least one set of circuit board connectors, the circuit board connectors are disposed on the substrate, the circuit section includes at least one set of connection circuits, and the connection circuits are connected to the ring circuit and the circuit board connectors.

According to an embodiment of the present disclosure, an outer diameter of the circuit board connector ranges from 0.005 mm to 0.8 mm.

According to an embodiment of the present disclosure, the outer diameter of the circuit board connector ranges from 0.1 mm to 0.5 mm.

According to an embodiment of the present disclosure, a width of the circuit section ranges from 0.001 mm to 0.5 mm.

According to an embodiment of the present disclosure, a width of the connection circuit ranges from 0.001 mm to 0.5 mm.

According to an embodiment of the present disclosure, a width of the ring circuit ranges from 0.001 mm to 0.5 mm.

According to an embodiment of the present disclosure, the width of the circuit section ranges from 0.02 mm to 0.1 mm.

According to an embodiment of the present disclosure, the width of the connection circuit ranges from 0.02 mm to 0.1 mm.

According to an embodiment of the present disclosure, the width of the ring circuit ranges from 0.02 mm to 0.1 mm.

According to an embodiment of the present disclosure, a spacing between adjacent circuit sections ranges from 0.001 mm to 0.5 mm.

According to an embodiment of the present disclosure, a spacing between adjacent connection circuits ranges from 0.001 mm to 0.5 mm.

According to an embodiment of the present disclosure, a spacing between adjacent ring circuits ranges from 0.001 mm to 0.5 mm.

According to an embodiment of the present disclosure, the spacing between the adjacent circuit sections ranges from 0.02 mm to 0.1 mm.

According to an embodiment of the present disclosure, the spacing between the adjacent connection circuits ranges from 0.02 mm to 0.1 mm.

According to an embodiment of the present disclosure, the spacing between the adjacent ring circuits ranges from 0.02 mm to 0.1 mm.

According to an embodiment of the present disclosure, the ring circuit protrudes from a surface of the substrate.

According to an embodiment of the present disclosure, the circuit section is formed on the surface of the substrate by plating or printing, so that the ring circuit formed by the circuit section protrudes from the surface of the substrate.

According to an embodiment of the present disclosure, the ring circuit includes a first circuit unit, and the first circuit unit is in a complete ring such that the first circuit unit surrounds the photosensitive element.

According to an embodiment of the present disclosure, the ring circuit includes at least one first circuit unit and at least one second circuit unit, the first circuit unit extends annularly around the photosensitive element, at least one opening is formed in the first circuit unit, and the second circuit unit is formed at the opening, such that at least one slit is formed between the first circuit unit and the second circuit unit.

According to an embodiment of the present disclosure, the slit is elongated and extends from an interior to an exterior of the substrate.

According to an embodiment of the present disclosure, a blocking circuit is formed at an end of the first circuit unit, the second circuit unit includes at least one extension circuit, and an extension direction of the blocking circuit is substantially the same as that of the extension circuit, such that slits are formed between the blocking circuit and the extension circuit and between adjacent extension circuits.

According to an embodiment of the present disclosure, at least a part of the extension circuit extends bendingly, such that the slits formed between the blocking circuit and the extension circuit and between the adjacent extension circuits extend bendingly.

According to an embodiment of the present disclosure, at least one of the first circuit unit or the second circuit unit forms at least one blocking protrusion, and the blocking protrusion extends to the slit to reduce a size of the slit.

According to an embodiment of the present disclosure, at least a part of an outer edge of a pressing portion of a molding die is pressed against at least a part of the ring circuit during the molding process.

According to another aspect of the present disclosure, the present disclosure further provides a circuit board, at least one photosensitive element is conductively connected to the circuit board, and the circuit board includes: a substrate, the substrate having an edge region; and at least one circuit section. The circuit section is formed on the substrate, the photosensitive element and the circuit section are conductively connected, the circuit section forms an annular electromagnetic field shielding portion in the edge region of the substrate, and the electromagnetic field shielding portion surrounds the photosensitive element to prevent external electromagnetic waves from interfering with the photosensitive element.

According to another aspect of the present disclosure, the present disclosure further provides a manufacturing method of a circuit board, the manufacturing method including following steps: (A) providing a substrate; and (B) forming at least one circuit section at least in an edge region of the substrate, where the circuit section forms at least one annular blocking portion in the edge region, such that after a photosensitive element and the circuit board are conductively connected together, the blocking portion surrounds the photosensitive element.

According to an embodiment of the present disclosure, the blocking portion is an electromagnetic field shielding portion to prevent external electromagnetic force from interfering with the photosensitive element.

According to an embodiment of the present disclosure, in step (B), the circuit section is formed at least in the edge region of the substrate by plating or printing, so that the circuit section protrudes from a surface of the substrate.

According to an embodiment of the present disclosure, in step (B), after the circuit section forms the blocking portion in the edge region of the substrate, the blocking portion separates the edge region into a substrate inner portion and a substrate outer portion, the substrate inner portion is used for conductively connecting the photosensitive element with the circuit board, and the substrate outer portion is used for mounting an electronic component.

According to another aspect of the present disclosure, the present disclosure further provides a molded photosensitive assembly, including: a molded base, the molded base having at least one light window; at least one photosensitive element; and at least one circuit board, the circuit board further including: a substrate, the substrate having an edge region; and at least one circuit section, where the circuit section is formed on the substrate, the photosensitive element and the circuit section are conductively connected, the circuit section forms a ring circuit in the edge region of the substrate, the ring circuit surrounds the photosensitive element, the molded base integrally incorporates a part of the edge region and a part of the ring circuit, and a photosensitive region of the photosensitive element corresponds to the light window.

According to an embodiment of the present disclosure, the edge region of the substrate has a substrate inner portion and a substrate outer portion, the substrate inner portion and the substrate outer portion are respectively located inside and outside the ring circuit, and the molded base integrally incorporates the substrate outer portion and an outer portion of the ring circuit.

According to an embodiment of the present disclosure, the molded photosensitive assembly further includes at least one electronic component, the circuit board includes at least one circuit board connector, the circuit board connector is disposed at the substrate outer portion, the circuit section includes at least one connection circuit, the connection circuit is connected to the circuit board connector and the ring circuit, the electronic component is mounted to the circuit board connector, and the molded base covers the at least one electronic component.

According to an embodiment of the present disclosure, the ring circuit includes a first circuit unit, and the first circuit unit is in a complete ring such that the first circuit unit surrounds the photosensitive element.

According to an embodiment of the present disclosure, the ring circuit includes at least one first circuit unit and at least one second circuit unit, the first circuit unit extends annularly around the photosensitive element, at least one opening is formed in the first circuit unit, and the second circuit unit is formed at the opening, such that at least one slit is formed between the first circuit unit and the second circuit unit.

According to an embodiment of the present disclosure, the slit is elongated and extends between the substrate inner portion and the substrate outer portion.

According to an embodiment of the present disclosure, a blocking circuit is formed at an end of the first circuit unit, the second circuit unit includes at least one extension circuit, and an extension direction of the blocking circuit is substantially the same as that of the extension circuit, such that slits are formed between the blocking circuit and the extension circuit and between adjacent extension circuits.

According to an embodiment of the present disclosure, at least a part of the extension circuit extends bendingly, such that the slits formed between the blocking circuit and the extension circuit and between the adjacent extension circuits extend bendingly.

According to an embodiment of the present disclosure, at least one of the first circuit unit or the second circuit unit forms at least one blocking protrusion, and the blocking protrusion extends to the slit to reduce a size of the slit.

According to an embodiment of the present disclosure, an opening of the slit at the substrate outer portion corresponds to the circuit board connector.

According to another aspect of the present disclosure, the present disclosure further provides a molded photosensitive assembly, including: a molded base, the molded base having at least one light window; at least one photosensitive element; at least one annular blocking portion; and a circuit board, where the photosensitive element and the circuit board are conductively connected, the blocking portion is in an edge region of the circuit board, the blocking portion surrounds the photosensitive element, the blocking portion blocks a molding material for forming the molded base from entering a region where the photosensitive element is located from the edge region of the circuit board to form the molded base integrally incorporating with a part of the edge region of the circuit board and a part of the blocking portion after the molding material is consolidated, and a photosensitive region of the photosensitive element corresponds to the light window.

According to an embodiment of the present disclosure, the circuit board further includes at least one substrate and at least one circuit section formed on the substrate, the photosensitive element is conductively connected to the circuit section, and the circuit section forms the blocking portion in the edge region of the circuit board.

According to an embodiment of the present disclosure, the circuit section is formed on the substrate by plating or printing, so that the blocking portion formed by the circuit section protrudes from a surface of the substrate.

According to another aspect of the present disclosure, the present disclosure further provides a manufacturing method of a molded photosensitive assembly, the manufacturing method including following steps: (a) forming an annular blocking portion in an edge region of a substrate through a circuit section, where the edge region forms a substrate outer portion outside the blocking portion; (b) conductively connecting a photosensitive element with the circuit section, where the blocking portion surrounds the photosensitive element; (c) pressing a pressing face of a molding die against the blocking portion to isolate the photosensitive element from the substrate outer portion of the edge region, where the photosensitive element corresponds to an anti-pressure space of the molding die, and the substrate outer portion corresponds to a base molding space of the mold; and (d) preventing, by the blocking portion, a fluid molding material added to the base molding space from flowing from the base molding space to the anti-pressure space, so that after the molding material is consolidated in the base molding space, a molded base integrally incorporating a part of the substrate outer portion and a part of the blocking portion and having a light window is formed, where a photosensitive region of the photosensitive element corresponds to the light window.

According to an embodiment of the present disclosure, in step (a), a safety distance is reserved between the blocking portion and the photosensitive element to prevent, in step (d), the molding material at a high temperature from transferring the heat to the photosensitive element to cause an undesirable phenomenon of deformation of the photosensitive element.

According to an embodiment of the present disclosure, in the method, a substrate inner portion is formed inside the edge region to reserve the safety distance between the blocking portion and the photosensitive element.

According to an embodiment of the present disclosure, in the method, a set of electronic components is respectively mounted at intervals to the substrate outer portion, such that the molded base covers the electronic components in step (d).

According to an embodiment of the present disclosure, in step (a), the blocking portion is formed through forming a ring circuit in the edge region by the circuit section.

According to an embodiment of the present disclosure, the ring circuit is a complete ring, such that in step (d), the blocking portion formed by the ring circuit blocks the molding material from flowing from the base molding space to the anti-pressure space.

According to an embodiment of the present disclosure, the ring circuit forms at least one elongated slit to connect a substrate inner portion and the substrate outer portion of the substrate, and when the molding material flows from the base molding space to the slit, a flow rate of the molding material rapidly decreases to prevent the molding material from entering the substrate inner portion.

According to an embodiment of the present disclosure, in the method, the slit extends bendingly, so that when the molding material flows from the base molding space to the slit, the flow rate of the molding material rapidly decreases to prevent the molding material from entering the substrate inner portion.

According to an embodiment of the present disclosure, in the method, a circuit board connecting portion is formed at an opening of the slit toward the substrate outer portion to prevent the molding material from directly entering the slit from the base molding space.

According to an embodiment of the present disclosure, in step (c), a cover film is disposed between the pressing face and the blocking portion to increase a sealing property between the pressing face and the blocking portion, thereby preventing the molding material from flowing from the base molding space to the anti-pressure space in step (d).

According to an embodiment of the present disclosure, step (d) is preceded by step (b), that is, the molded base integrally incorporating a part of the substrate outer portion and a part of the blocking portion is formed first, and then the photosensitive element and the circuit section are conductively connected such that the photosensitive element corresponds to the light window.

According to another aspect of the present disclosure, the present disclosure provides a camera module, including: at least one optical lens; at least one photosensitive element; at least one annular blocking portion; and at least one circuit board, where the photosensitive element and the circuit board are conductively connected, the blocking portion is formed on the circuit board, the blocking portion surrounds the photosensitive element, and the optical lens is disposed in a photosensitive path of the photosensitive element.

According to an embodiment of the present disclosure, the camera module further includes a molded base, the molded base has at least one light window, the blocking portion blocks a molding material for forming the molded base from entering a region where the photosensitive element is located from an edge region of the circuit board to form the molded base integrally incorporating with a part of the edge region of the circuit board and a part of the blocking portion after the molding material is consolidated, and the photosensitive element corresponds to the light window, such that the light window provides a light path for the photosensitive element and the optical lens.

According to an embodiment of the present disclosure, the circuit board includes a substrate and at least one circuit section formed on the substrate, the circuit section forms a ring circuit in an edge region of the substrate of the circuit board, and the ring circuit forms the blocking portion.

According to an embodiment of the present disclosure, the circuit board includes a substrate and at least one circuit section formed on the substrate, the circuit section forms an annular electromagnetic field shielding portion in an edge region of the substrate of the circuit board to prevent external electromagnetic force from interfering with the photosensitive element, and the electromagnetic field shielding portion forms the blocking portion.

According to an embodiment of the present disclosure, the edge region of the substrate has a substrate inner portion and a substrate outer portion, the substrate inner portion and the substrate outer portion are respectively on two sides of the ring circuit, and the molded base integrally incorporates the substrate outer portion and an outer portion of the ring circuit.

According to an embodiment of the present disclosure, the camera module further includes at least one electronic component, the electronic component is disposed on the substrate outer portion, and the molded base covers the electronic component.

According to an embodiment of the present disclosure, the camera module further includes at least one driver, the optical lens is assembled to the driver, and the driver is assembled to a top surface of the molded base, so that the optical lens is held in a photosensitive path of the photosensitive element by means of the driver.

According to an embodiment of the present disclosure, the camera module further includes at least one lens barrel, the optical lens is disposed on the lens barrel, and the lens barrel is assembled to a top surface of the molded base, so that the optical lens is held in a photosensitive path of the photosensitive element by means of the lens barrel.

According to an embodiment of the present disclosure, the camera module further includes at least one lens barrel, the optical lens is disposed on the lens barrel, and the lens barrel integrally extends over a top surface of the molded base, so that the optical lens is held in a photosensitive path of the photosensitive element by means of the lens barrel.

According to an embodiment of the present disclosure, the camera module further includes at least one optical filtering element, and the optical filtering element is held between the optical lens and the photosensitive element.

According to an embodiment of the present disclosure, the camera module further includes at least one optical filtering element, and the optical filtering element is held between the optical lens and the photosensitive element.

According to an embodiment of the present disclosure, the optical filtering element is assembled to the top surface of the molded base such that the optical filtering element is held between the photosensitive element and the optical lens.

According to an embodiment of the present disclosure, the top surface of the molded base has at least an inner surface and an outer surface, the optical filtering element is assembled to the inner surface, and the driver is assembled to the outer surface.

According to an embodiment of the present disclosure, the inner surface and the outer surface have a height difference to form at least one groove of the molded base, the groove is connected to the light window, and the optical filtering element is assembled in the groove.

According to an embodiment of the present disclosure, the circuit board includes a substrate and at least one circuit section formed on the substrate, the circuit section forms an annular electromagnetic field shielding portion in an edge region of the substrate to prevent external electromagnetic force from interfering with the photosensitive element, and the electromagnetic field shielding portion forms the blocking portion.

According to an embodiment of the present disclosure, the camera module further includes a lens holder, the lens holder has at least one light through hole, the lens holder is assembled to the edge region, and a photosensitive region of the photosensitive element corresponds to the light through hole, such that the light through hole provides a light path for the photosensitive element and the optical lens.

According to an embodiment of the present disclosure, the camera module further includes at least one optical filtering element, and the optical filtering element is assembled to the lens holder such that the optical filtering element is held between the optical lens and the photosensitive element.

According to an embodiment of the present disclosure, the camera module further includes at least one driver, the optical lens is assembled to the driver, and the driver is assembled to the lens holder, so that the optical lens is held in a photosensitive path of the photosensitive element by means of the driver.

According to an embodiment of the present disclosure, the camera module further includes at least one lens barrel, the optical lens is assembled to the lens barrel, and the lens barrel is assembled to the lens holder, so that the optical lens is held in a photosensitive path of the photosensitive element by means of the lens holder.

According to another aspect of the present disclosure, the present disclosure further provides an electronic device, including: an electronic device body; and at least one camera module. The camera module is disposed on the electronic device body to acquire an image, and the camera module includes: at least one optical lens; at least one photosensitive element; at least one annular blocking portion; and a circuit board. The photosensitive element and the circuit board are conductively connected, the blocking portion is formed on the circuit board, the blocking portion surrounds the photosensitive element, and the optical lens is disposed in a photosensitive path of the photosensitive element.

DETAILED DESCRIPTION OF EMBODIMENTS

The following description is provided to disclose the present disclosure to enable those skilled in the art to implement the present disclosure. Preferred embodiments are provided in the following description only as examples and modifications will be apparent to those skilled in the art. The general principles of the present disclosure defined in the following description may be applied to other embodiments, alternatives, modifications, equivalents, and other technical solutions without departing from the spirit and scope of the present disclosure.

It should be understood by those skilled in the art that in the disclosure of the present disclosure, the orientations or positional relationships indicated by the terms "longitudinal", "lateral", "up", "down", "front", "rear", "left", "right", "vertical", "horizontal", "top", "bottom", "inner", "outer", etc., are based on the orientations or positional relationships shown in the accompanying drawings. These terms are merely for convenience of describing the present disclosure and simplifying the description, and do not indicate or imply that the device or element referred must have a particular orientation, and be constructed and operated in a particular orientation, and thus the above terms should not be construed as limiting the present disclosure.

It may be appreciated that the term "a" should be interpreted as "at least one" or "one or more", that is, in one embodiment, the number of one element may be one, and in other embodiments, the number of the element may be multiple, so the term "a" cannot be construed as limiting the quantity.

Refer to FIG. 2 to FIG. 10 of the drawings of the present disclosure, a camera module 1 according to a preferred embodiment of the present disclosure is illustrated. The camera module 1 includes at least one optical lens 10, at least one photosensitive element 20, and a circuit board 30.

Figure 1:
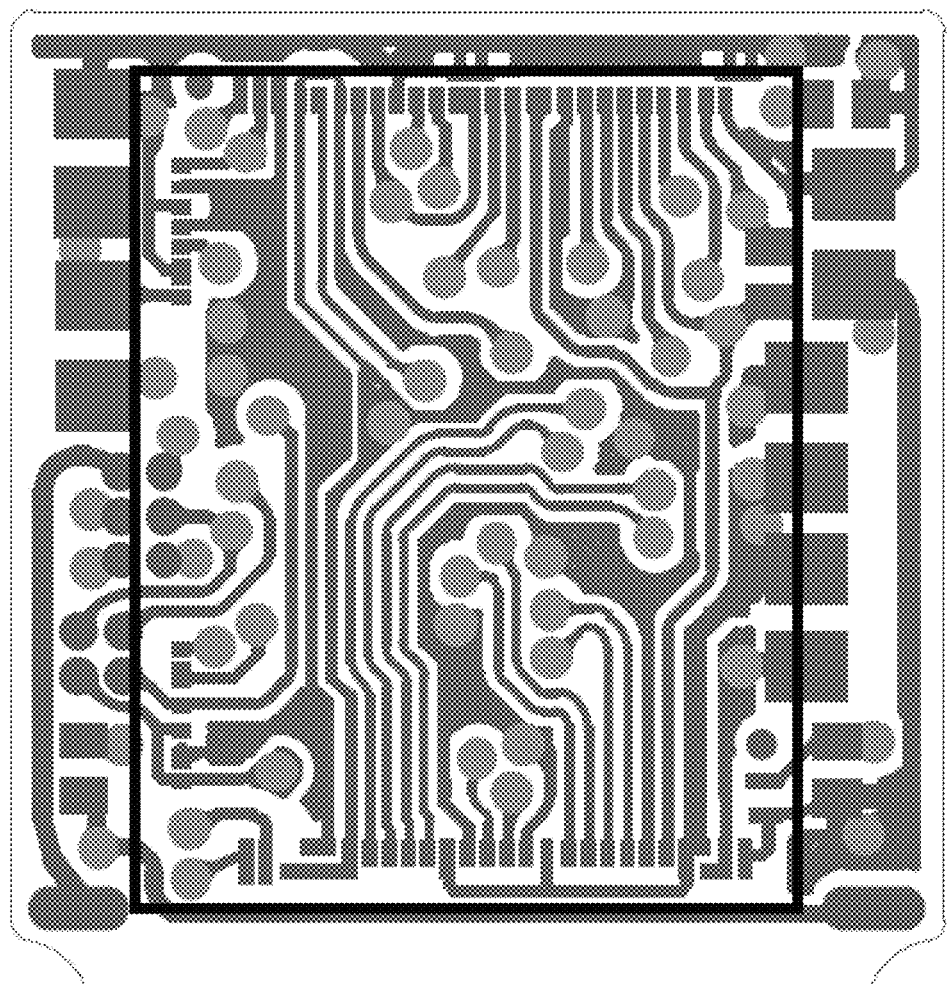
FIG. 1 is a top view of a circuit board in the prior art.
Figure 2:
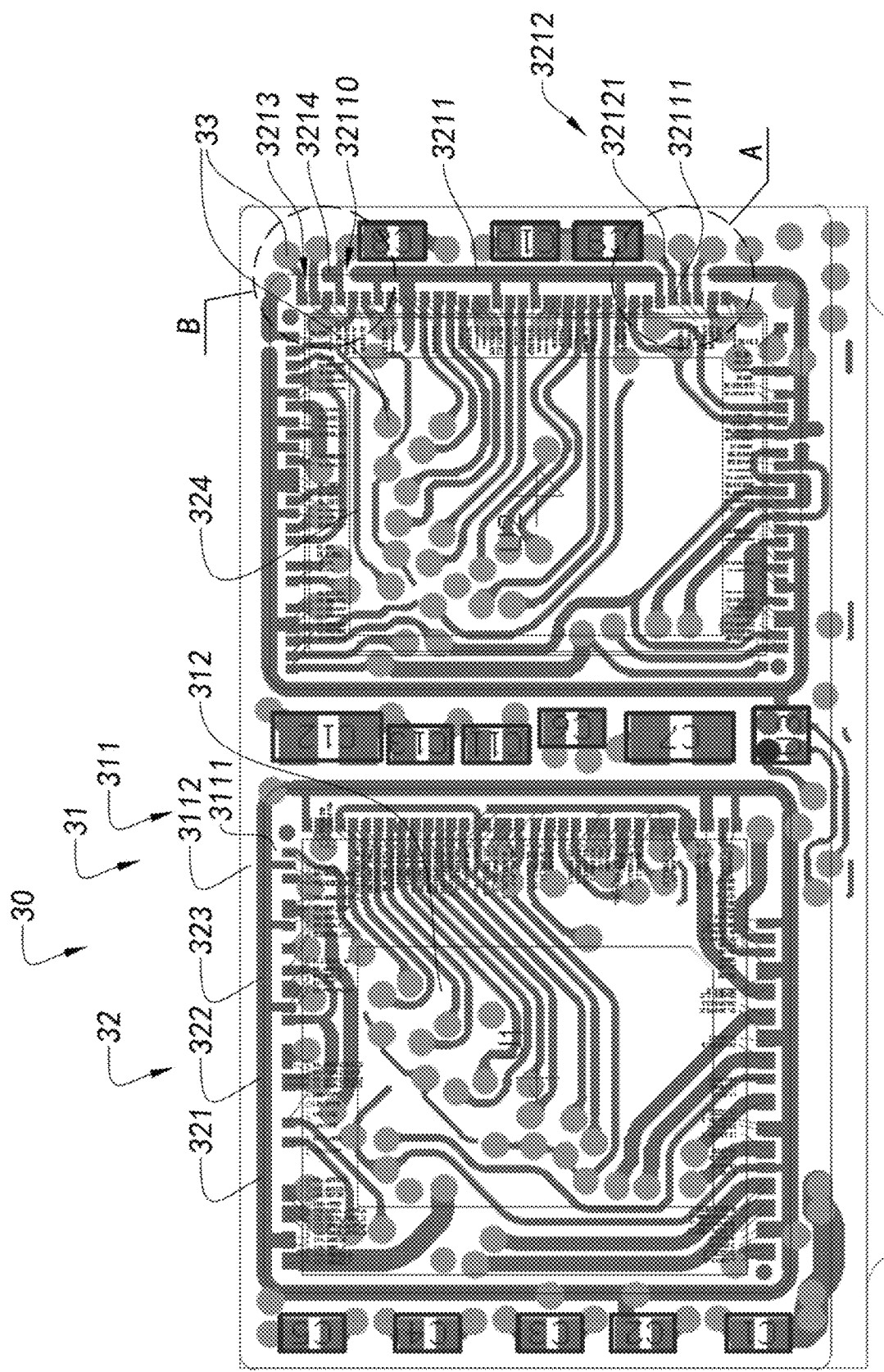
FIG. 2 is a top view of a circuit board according to a preferred embodiment of the present disclosure.
Figure 3:
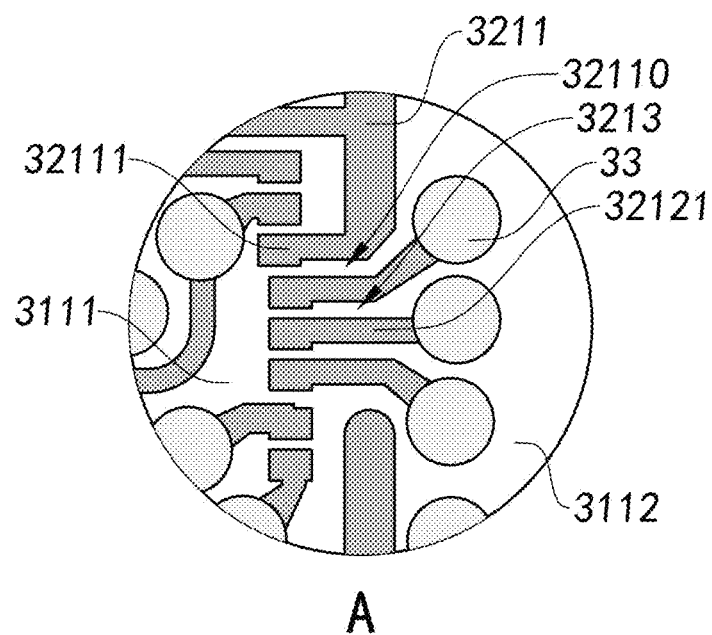
FIG. 3 is a partial enlargement view of FIG. 2 at a position A.
Figure 4:
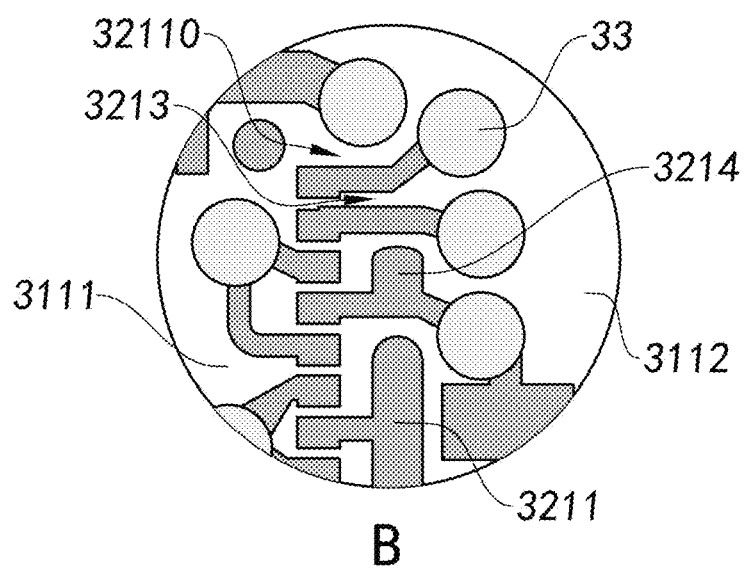
FIG. 4 is a partial enlargement view of FIG. 2 at a position B.

Refer to FIG. 2 to FIG. 4, the circuit board 30 includes a substrate 31 and at least one circuit section 32. The substrate 31 has an edge region 311, the circuit section 32 forms a ring circuit 321 at the edge region 311 of the substrate 31, the photosensitive element 20 is connected to the circuit section 32, and the ring circuit 321 surrounds the photosensitive element 20 such that the ring circuit 321 is able to protect the photosensitive element 20 from being contaminated in a subsequent molding process. The optical lens 10 is disposed in a photosensitive path of the photosensitive element 20. Light reflected by an object enters the interior of the camera module from the optical lens 10, and is subsequently received by the photosensitive element 20 and photoelectrically converted to obtain an image associated with the object.

It is worth mentioning that although the camera module implemented as a dual-lens camera module is taken as an example to illustrate the features and advantages of the present disclosure in FIG. 2 to FIG. 10 and in the following description, it may be appreciated by those skilled in the art that the camera module 1 may be configured with fewer or more optical lenses 10 to form a single-lens camera module or an array camera module, and the present disclosure is not limited in this respect.

In this example, the substrate 31 further includes at least one flat chip mounting region 312. The edge region 311 and each chip mounting region 312 are integrally formed, the edge region 311 is outside each chip mounting region 312, each photosensitive element 20 is mounted on each chip mounting region 312 of the substrate 31, and each photosensitive element 20 is connected to each circuit section 32. It may be appreciated that when the substrate 31 of the circuit board 30 has only one chip mounting region 312, the chip mounting region 312 may be located in the middle of the substrate 31.

Further, each photosensitive element 20 is conductively connected to each circuit section 32 of the circuit board 30 through a set of leads 40 that extend respectively, and two ends of the lead 40 are bent to connect the photosensitive element 20 with the circuit section 32 of the circuit board 30.

It may be appreciated by those skilled in the art that the process of using the lead 40 to conductively connect the photosensitive element 20 with the circuit section 32 of the circuit board 30 may be a wire bonding process, that is, the lead 40 is formed between the photosensitive element 20 and the circuit section 32 of the circuit board 30 by wire bonding, so that the lead 40 conductively connects the photosensitive element 20 with the circuit board 30. It is worth mentioning that the wire bonding direction of the lead 40 may not be limited. For example, in an example, the wire bonding direction of the lead 40 may be from the photosensitive element 20 to the circuit board 30. In another example, the wire bonding direction of the lead 40 may also be from the circuit board 30 to the photosensitive element 20. In addition, the lead 40 may be a gold wire, or any material capable of transmitting electrical signals between the photosensitive element 20 and the circuit board 22, such as a silver wire or a copper wire.

In addition, a set of connectors may be respectively disposed on a non-photosensitive region of the photosensitive element 20 and the substrate 31 of the circuit board 30. The connector disposed on the substrate 31 is electrically connected to the circuit section 32, the two ends of the lead 40 are respectively connected to the connector of the photosensitive element 20 and the connector of the circuit board 30, and in such a way, the photosensitive element 20 and the circuit board 30 are conductively connected. It is worth mentioning that the type of the connectors disposed on the non-photosensitive region of the photosensitive element 20 and the substrate 31 of the circuit board 30 may not be limited. For example, the connectors disposed on the non-photosensitive region of the photosensitive element 20 and the substrate 31 of the circuit board 30 may be connecting pads, etc.

The circuit section 32 forms the ring circuit 321 at the edge region 311 of the substrate 31, so that the edge region 311 of the substrate 31 is divided by the ring circuit 321 into a substrate inner portion 3111 and a substrate outer portion 3112. The substrate inner portion 3111 and the substrate outer portion 3112 are respectively located on two sides of the ring circuit 321. The connector disposed on the substrate 31 is located at the substrate inner portion 3111 of the substrate 31, that is, the ring circuit 321 is located outside the lead 40, so that the ring circuit 321 can protect not only the photosensitive element 20 but also the lead 40 in the subsequent molding process.

It may be appreciated by those skilled in the art that the circuit section 32 is formed on the surface of the substrate 31 by plating or printing, so that after the circuit section 32 is formed on the surface of the substrate 31, the circuit section 32 protrudes the surface of the substrate 31, and thus the ring circuit 321 also protrudes the surface of the substrate 31 to form an annular blocking portion 322. That is, the circuit section 32 may form the annular blocking portion 322 at the edge region 311 of the substrate 31, where the blocking portion 322 surrounds the photosensitive element 20, so that the blocking portion 322 can protect the photosensitive element 20 during the molding process. Preferably, the blocking portion 322 is located outside the lead 40, so that the blocking portion 322 can protect the lead 40 during the molding process. That is, the blocking portion 322 may also divide the edge region 311 of the substrate 31 into the substrate inner portion 3111 and the substrate outer portion 3112.

It may also be appreciated by those skilled in the art that an annular electromagnetic field shielding portion 323 may be formed when the ring circuit 321 of the circuit section 32 is grounded or properly energized. The electromagnetic field shielding portion 323 surrounds the photosensitive element 20, so that the photosensitive element 20 is in an electromagnetic field enclosed environment and is prevented from the interference of outside electromagnetic waves, and the interference of electromagnetic waves generated by the photosensitive element 20 to the outside is reduced to ensure the reliability of the camera module 1 during imaging.

The circuit board 30 further includes at least one set of circuit board connectors 33. The circuit board connectors 33 are disposed at intervals at the edge region 311 of the substrate 31, for example, each of the circuit board connectors 33 may be at, but not limited to, the substrate outer portion 3112 of the substrate 31. The circuit board connectors 33 are used to connect circuits forming the multilayer substrate of the circuit board 30. Preferably, the cross sections of the circuit board connectors 33 may be implemented as, but not limited to, a circular shape. The circuit section 32 further includes at least one set of connecting circuits 324 that are conductively connected to the circuit board connectors 33 and the ring circuit 321.

It may be appreciated that, compared with a conventional circuit board, the ring circuit 321 of the circuit board 33 of the present disclosure is annular and surrounds the photosensitive element 20, so that each of the same defined circuit board connectors 33 may be conductively connected to the ring circuit 321 through the nearby connecting circuit 324. In this way, electrical signals are transmitted faster, and the response speed of the camera module 1 is effectively improved.

In one example of the present disclosure, the outer diameter of the circuit board connector 33 is greater than the width of the ring circuit 321. Nevertheless, in some specific examples, it is also possible that the outer diameter of the circuit board connector 33 is smaller than the width of the ring circuit 321. It is supposed that the outer diameter of the circuit board connector 33 is parameter a, the width of the ring circuit 321 is parameter b, and the spacing between adjacent ring circuits 321 is parameter c. The parameter a ranges from 0.005 mm to 0.8 mm, preferably from 0.1 mm to 0.5 mm; the parameter b ranges from 0.001 mm to 0.5 mm, preferably from 0.02 mm to 0.1 mm; and the parameter c ranges from 0.001 mm to 0.5 mm, preferably from 0.02 mm to 0.1 mm. Correspondingly, the width of the connecting circuit 324 is also the parameter b. Preferably, the spacing between adjacent connecting circuits 324 is also the parameter c. It may be appreciated by those skilled in the art that the width of the circuit section 32 is the parameter b, and the spacing between adjacent circuit sections 32 is also the parameter c.

In addition, the camera module 1 includes a molded base 50. The molded base 50 has at least one light window 51, the molded base 50 integrally incorporates a part of the edge region 311 of the circuit board 30 and apart of the ring circuit 321 to form a molded photosensitive assembly 200, and the photosensitive region of the photosensitive element 20 corresponds to the light window 51 such that the light window 51 provides a light path for the optical lens 10 and the photosensitive element 20. Preferably, the molded base 50 integrally incorporates the substrate outer portion 3112 of the circuit board 30 and the outer portion of the ring circuit 321.

That is, the molded photosensitive assembly 200 includes at least one photosensitive element 20, a circuit board 30, and a molded base 50, where the photosensitive element 20 is mounted to the circuit board 30, the molded base 50 integrally incorporates apart of the circuit board 30 such that the molded base 50 covers a part of the circuit board 30, and the photosensitive region of the photosensitive element 20 corresponds to the light window 51 of the molded base 50. It may be appreciated that the photosensitive element 20 may be first mounted to the circuit board 30, and then the molded base 50 integrally incorporates a part of the circuit board 30; or the molded base 50 integrally incorporates a part of the circuit board 30 first, and then the photosensitive element 20 is mounted to the circuit board 30, and the present disclosure is not limited thereto.

The camera module 1 further includes a set of electronic components 60, where the electronic components 60 may be mounted to the edge region 311 of the circuit board 30 by a Surface Mount Technology (SMT). After the electronic components 60 are mounted to the edge region 311 of the circuit board 30, the electronic components 60 are conductively connected to the circuit board connectors 33. Preferably, the electronic components 60 may be directly mounted to the circuit board connectors 33 to conductively connect the electronic components 60 with the circuit board connectors 33.

It is worth mentioning that the electronic components 60 and the photosensitive element 20 may be on the same side or opposite sides of the circuit board 30. In this embodiment, the electronic components 60 and the photosensitive element 20 are on the same side of the circuit board 30, and the molded base 50 covers at least one of the electronic components 60 after the molded base 50 is molded. Preferably, the molded base 50 covers each of the electronic components 60 to isolate adjacent electronic components 60 and isolate the electronic components 60 and the photosensitive element 20 by the molded base 50, so that even if the adjacent electronic components 60 are relatively close, the molded base 50 may also prevent the adjacent electronic components 60 from contacting or interfering with each other, and the method that the molded base 50 covers the electronic components 60 may also prevent contaminants generated on the surface of the electronic components 60 from contaminating the photosensitive region of the photosensitive element 20. In addition, the method that the molded base 50 covers the electronic components 60 may also enable the circuit board 30 of a small area to be mounted with more electronic components 60 so as to improve the imaging quality of the camera module 1. It is worth mentioning that the type of the electronic components 60 may include, but is not limited to, resistors, capacitors, drivers, or the like.

The camera module 1 further includes at least one optical filtering element 70, where the optical filtering element 70 is disposed between the optical lens 10 and the photosensitive element 20 to filter the light entering the camera module 1 from the optical lens 10, and then the filtered light is received by the photosensitive element 20 for imaging. The optical filtering element 70 may be assembled to a top surface of the molded base 50 such that the optical filtering element 70 is held between the photosensitive element 20 and the optical lens 10.

It is worth mentioning that the optical filtering element 70 may be directly assembled to the top surface of the molded base 50; or the optical filtering element 70 is assembled to a support first, then the support is assembled to the top surface of the molded base 50, and in this way, the area of the optical filtering element 70 may be reduced to lower the manufacturing cost of the camera module 1.

It may be appreciated by those skilled in the art that in different examples of the camera module 1, the optical filtering element 70 may be implemented as different types, for example, the optical filtering element 70 is implemented as an infrared cut-off filter, a full-transmission spectral filter, other filter, or a combination of a plurality of filters. For example, the optical filtering element 70 is implemented as a combination of an infrared cut-off filter and a full-transmission spectral filter, that is, the infrared cut-off filter and the full-transmission spectral filter may be switched to be selectively located on the photosensitive path of the photosensitive element 20. For example, when the camera module 1 is used in an environment where light is sufficient during daytime, the infrared cut-off filter may be switched to the photosensitive path of the photosensitive element 20 to filter out infrared in the light reflected by an object and entering the camera module 1; and when the camera module 1 is used in a dark environment such as at night, the full-transmission spectral filter may be switched to the photosensitive path of the photosensitive element 20 to allow infrared in the light reflected by an object and entering the camera module 1 to pass.

The camera module 1 may be a fixed focus camera module or a zoom camera module. It may be appreciated that when the camera module 1 is implemented as a zoom camera module 1, the camera module 1 further includes at least one driver 80. After each optical lens 10 is assembled to the driver 80, the driver 80 is assembled to the top surface of the molded base 50 to hold the optical lens 10 in the photosensitive path of the photosensitive element 20, and the driver 80 is able to drive the optical lens 10 to move along the photosensitive path of the photosensitive element 20 to adjust the focal length of the camera module 1. That is, the optical lens 10 is disposed on the driver 80 by driving.

It is worth mentioning that the type of the driver 80 is not limited in the camera module 1 of the present disclosure. For example, in a specific example, the driver 80 may be implemented as any driver capable of driving the optical lens 10 to move along the photosensitive path of the photosensitive element 20, such as a voice coil motor, where the driver 80 is capable of receiving electrical energy and control signals to be in an operational state.

Further, the camera module 1 includes a bracket 400. The bracket 400 has at least one mounting space 401, the driver 80 is mounted in the mounting space 401 of the bracket 400, and the bracket 400 ensures the coaxiality of the each optical lens 10 so as to improve the imaging quality of the camera module 1. Preferably, a filler is filled between the inner wall of the bracket 400 and the outer wall of the driver 80 to prevent a gap from being formed between the inner wall of the bracket 400 and the outer wall of the driver 80, so that when the camera module 1 is assembled or used, the relationship between the optical lenses 10 does not change to ensure the reliability of the camera module 1. More preferably, the filler may be any material that is fluid and capable of being consolidated, such as glue.

FIG. 5 to FIG. 10 show a manufacturing process of the camera module 1.

Figure 5:
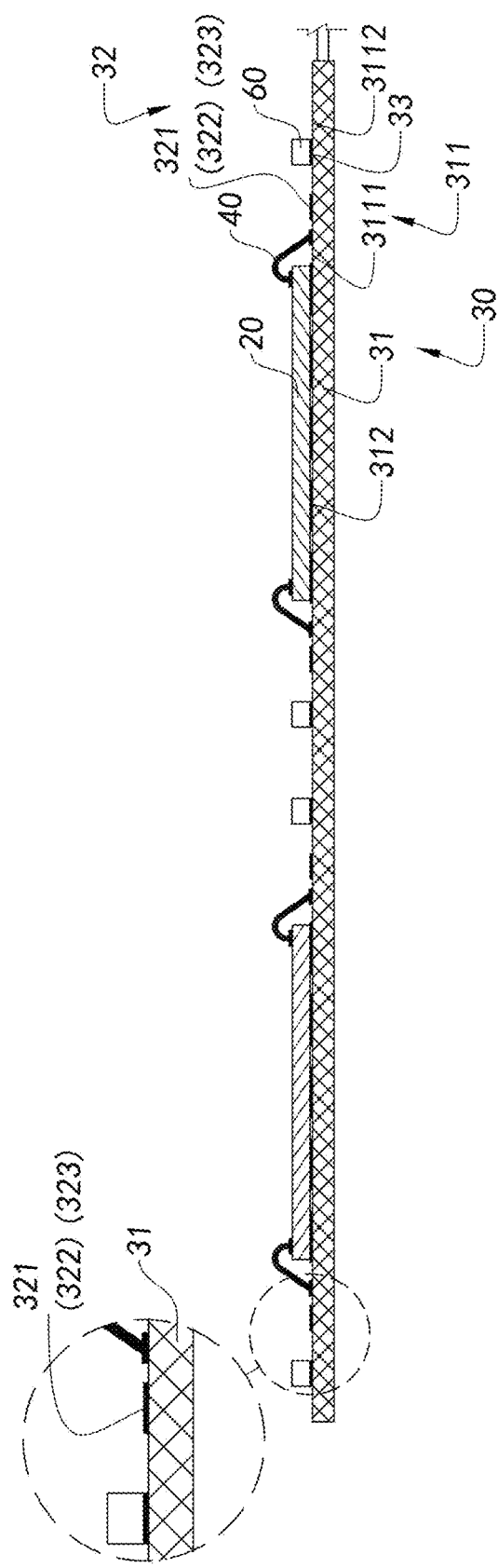
FIG. 5 is a schematic cross-sectional diagram of a manufacturing step 1 of a camera module according to a preferred embodiment of the present disclosure.

Specifically, referring to FIG. 5, the photosensitive element 20 is mounted to the chip mounting region 312 of the substrate 31 of the circuit board 30, the photosensitive element 20 is conductively connected to the circuit section 32 of the circuit board 30 via the lead 40, and the electronic component 60 is mounted to the circuit board connector 33 of the circuit board 30, so that the electronic component 60 is conductively connected to the photosensitive element 20 via the circuit section 32.

Figure 6:
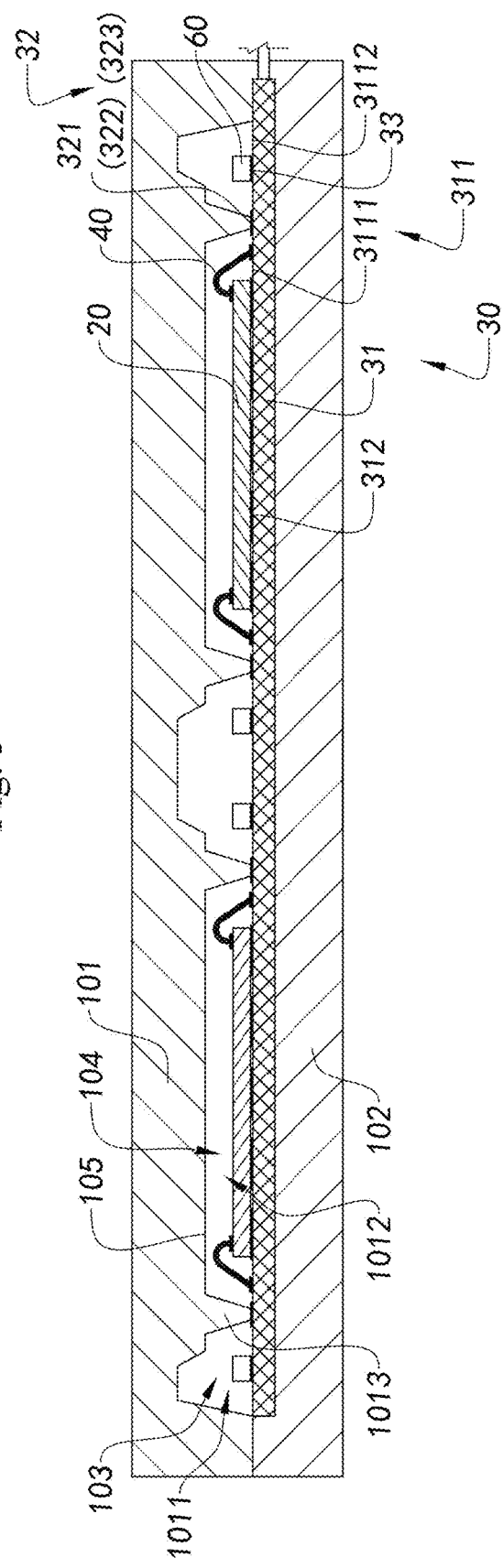
FIG. 6 is a schematic cross-sectional diagram of a manufacturing step 2 of the camera module according to the preferred embodiment of the present disclosure.

Referring to FIG. 6, the circuit board 30 mounted with the photosensitive element 20 and the electronic component 60 is placed in a molding die 100 for molding to form the molded base 50 integrally incorporating a part of the edge region 311 of the circuit board 30 and a part of the ring circuit 321, thus obtaining the molded photosensitive assembly 200.

Specifically, the molding die 100 includes an upper mold 101 and a lower mold 102. At least one of the upper mold 101 and the lower mold 102 can be moved, so that the upper mold 101 and the lower mold 102 can be clamped or drawn, and at least a base molding space 103 and a anti-pressure space 104 are formed between the upper mold 101 and the lower mold 102. The upper mold 101 has a base molding groove 1011, a pressure protection groove 1012, and an annular pressing portion 1013. The pressing portion 1013 integrally extends from one side of the upper mold 101 to separate the base molding groove 1011 and the pressure protection groove 1012. After the upper mold 101 and the lower mold 102 are clamped, the lower mold 102 seals the openings of the base molding groove 1011 and the pressure protection groove 1012, such that the base molding groove 1011 forms the base molding space 103, and the pressure protection groove 1012 forms the anti-pressure space 104.

It is worth mentioning that, in an embodiment, the lower mold 102 may be fixed, and the upper mold 101 is movable along a guide pillar relative to the lower mold 102, such that the upper mold 101 and the lower mold 102 are clamped when the upper mold 101 is moved towards the lower mold 102, and the upper mold 101 and the lower mold 102 are drawn when the upper mold 101 is moved away from the lower mold 102. When the upper mold 101 and the lower mold 102 are clamped, the base molding space 103 and the anti-pressure space 104 are respectively formed between the upper mold 101 and the lower mold 102.

In another embodiment, the upper mold 101 may be fixed, and the lower mold 102 is movable along a guide pillar relative to the upper mold 101, such that the upper mold 101 and the lower mold 102 are clamped when the lower mold 102 is moved towards the upper mold 101, and the upper mold 101 and the lower mold 102 are drawn when the lower mold 102 is moved away from the upper mold 101.

In addition, the molding die 100 further includes a cover film 105, where the cover film 105 is overlapped on an inner surface of the upper mold 101 to enhance the sealing property between the molding die 100 and the circuit board 30 when the upper mold 101 and the lower mold 102 of the molding die 100 are clamped, and to facilitate mold release after molding.

After the circuit board 30 mounted with the photosensitive element 20 and the electronic component 60 is placed in the upper mold 101 and/or the lower mold 102, the upper mold 101 and the lower mold 102 are operated to be clamped, so that the circuit board 30 mounted with the photosensitive element 20 and the electronic component 60 is located between the upper mold 101 and the lower mold 102. A pressing face of the pressing portion 1013 is pressed against the ring circuit 321, the photosensitive element 20 and the substrate inner portion 3111 of the circuit board 30 are located in the anti-pressure space 104 formed between the upper mold 101 and the lower mold 102, the substrate outer portion 3112 of the circuit board 30 is located in the base molding space 103 formed between the upper mold 101 and the lower mold 102, and the electronic component 60 mounted to the substrate outer portion 3112 of the circuit board 30 is located in the base molding space 103.

It is worth mentioning that because the photosensitive element 20 and the substrate inner portion 3111 of the circuit board 30 are located in the anti-pressure space 104, the inner surface of the upper mold 101 is prevented from being in direct contact with the lead 40 to avoid undesirable phenomena such as deformation of the lead 40 under force during molding, good electrical property of the lead 40 is ensured, and the imaging quality of the camera module 1 is further ensured.

The cover film 105 is located between the pressing face of the pressing portion 1013 and the ring circuit 321 of the circuit board 30 to increase the sealing property between the pressing portion 1013 and the ring circuit 321 of the circuit board 30, so that in the subsequent molding process, the molding material is prevented from flowing from the base molding space 103 to the anti-pressure space 104 through the pressing portion 1013 and the ring circuit 321 of the circuit board 30 to contaminate the photosensitive element 20. Preferably, the cover film 105 is overlapped on the inner surface, for forming the base molding groove 1011, of the upper mold 101 to facilitate mold drawing after the molded base 50 is formed at the end of the molding process. In addition, the cover film 105 is also capable of absorbing impact force of the pressing portion 1013 on the ring circuit 321 of the circuit board 30 when the upper mold 101 and the lower mold 102 are clamped, thereby preventing the ring circuit 321 from being damaged when the molding die 100 is clamped.

Figure 7:
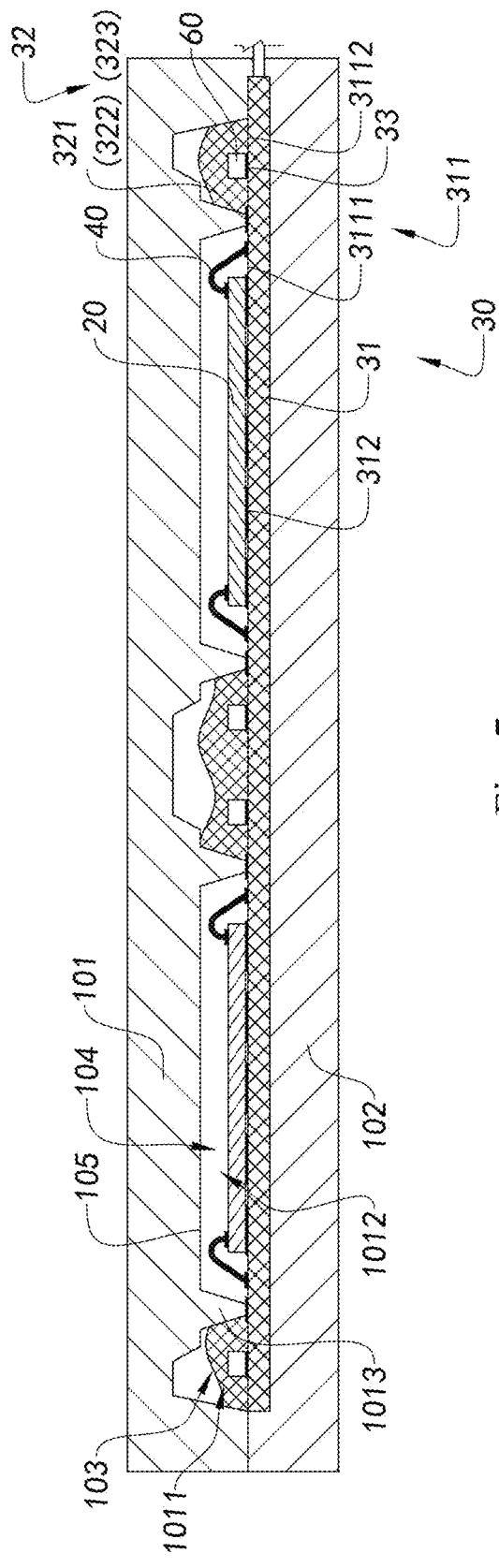
FIG. 7 is a schematic cross-sectional diagram of a manufacturing step 3 of the camera module according to the preferred embodiment of the present disclosure.
Figure 8:
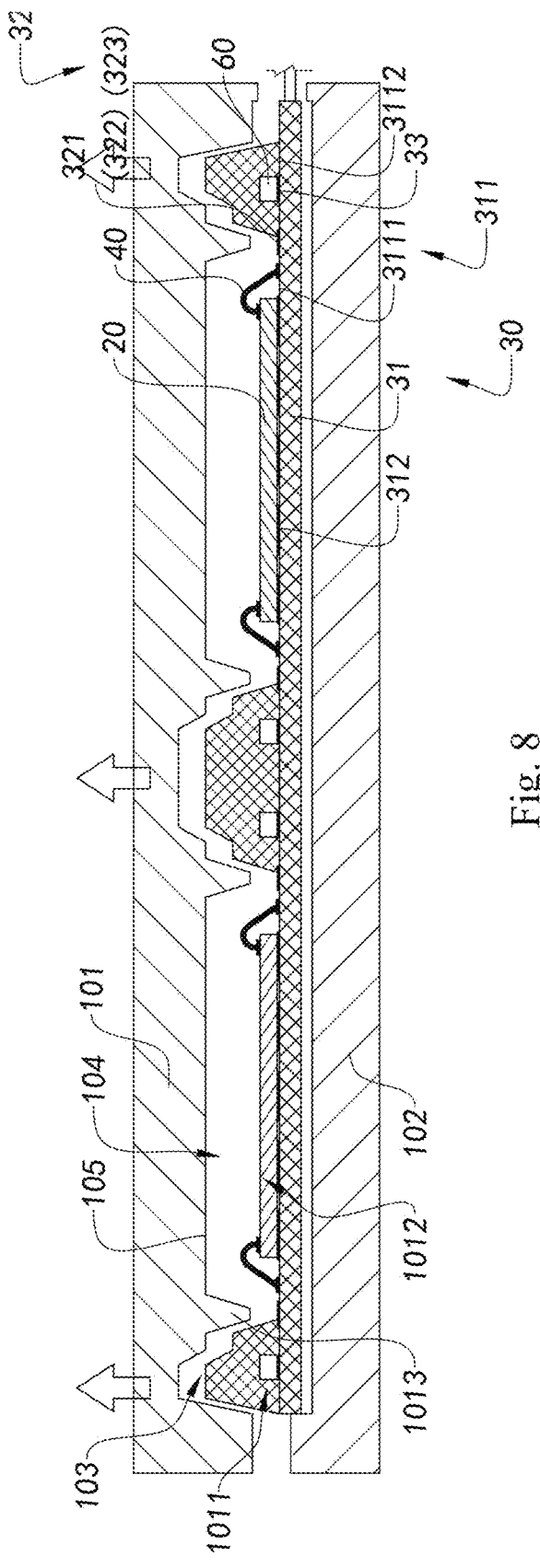
FIG. 8 is a schematic cross-sectional diagram of a manufacturing step 4 of the camera module according to the preferred embodiment of the present disclosure.

Referring to FIG. 7 and FIG. 8, a fluid molding material is added to the base molding space 103. The ring circuit 321 is capable of preventing the molding material from flowing from the base molding space 103 to the anti-pressure space 104 through the pressing portion 1013 and the ring circuit 321, and the molding material is consolidated in the base molding space 103 to form the molded base 50. The light window 51 of the molded base 50 is formed at a position corresponding to the pressing portion 1013 and the anti-pressure space 104. It may be appreciated that, after the molded base 50 is molded, the molded base 50 covers the substrate outer portion 3112 of the circuit board 30, the outer portion of the ring circuit 321 and the electronic component 60, and the photosensitive region of the photosensitive element 20 corresponds to the light window 51.

It is worth mentioning that the fluid molding material involved in the present disclosure may be a liquid material or a solid particulate material or a mixed material of liquid and solid particles. It may be understood that no matter whether the molding material is implemented as a liquid material or a solid particulate material or a mixed material of liquid and solid particles, the molding material is capable of being consolidated to form the molded base 50 after being added to the base molding space 103 of the molding die 100. For example, in a specific example of the present disclosure, the fluid molding material is implemented as a liquid thermosetting material, where the molding material is capable of being consolidated to form the molded base 50 after being added to the base molding space 103 of the molding die 100. It is worth mentioning that when the fluid molding material is added to the base molding space 103 of the molding die 100, the consolidation mode of the fluid molding material is not limited to the content and scope of the present disclosure.

In addition, the top surface of the molded base 50 may have at least an inner surface 52 and an outer surface 53. In an example, the inner surface 52 and the outer surface 53 of the molded base 50 are in the same plane, so that the optical filtering element 70 is assembled to the inner surface 52 of the molded base 50, and the driver 80 assembled with the optical lens 10 is assembled to the outer surface 53 of the molded base 50 later.

In another example, the inner surface 52 of the molded base 50 is lower than the outer surface 53 such that a height difference exists between the inner surface 52 and the outer surface 53 to form a groove 54 of the molded base 50, where the groove 54 is connected to the light window 51. It is worth mentioning that the groove 54 of the molded base 50 and the light window 51 of the molded base 50 are formed synchronously.

Figure 9:
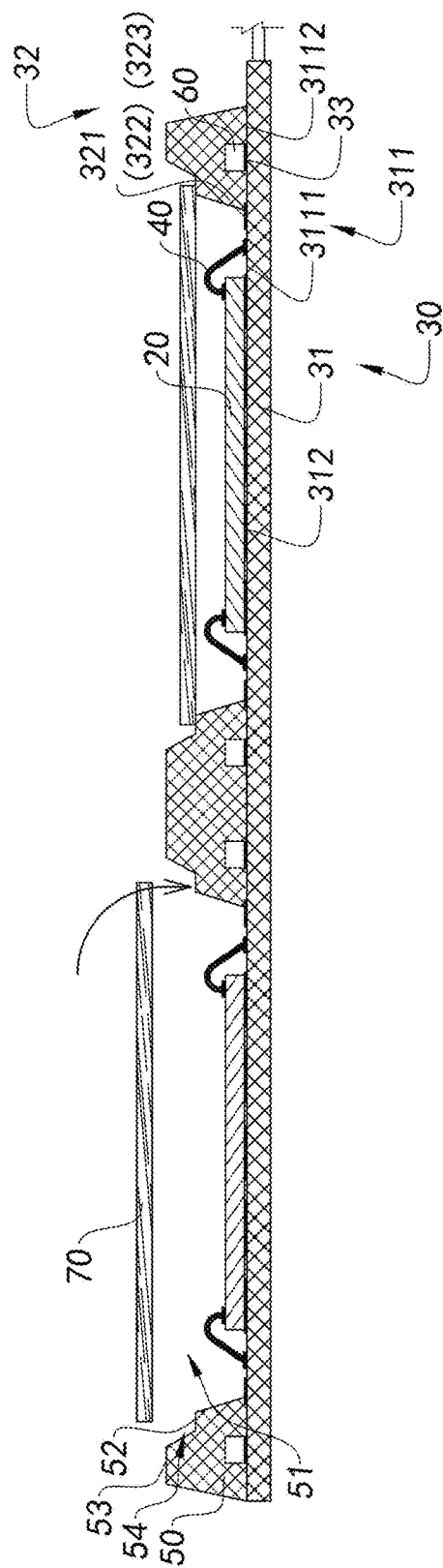
FIG. 9 is a schematic cross-sectional diagram of a manufacturing step 5 of the camera module according to the preferred embodiment of the present disclosure.
Figure 10:
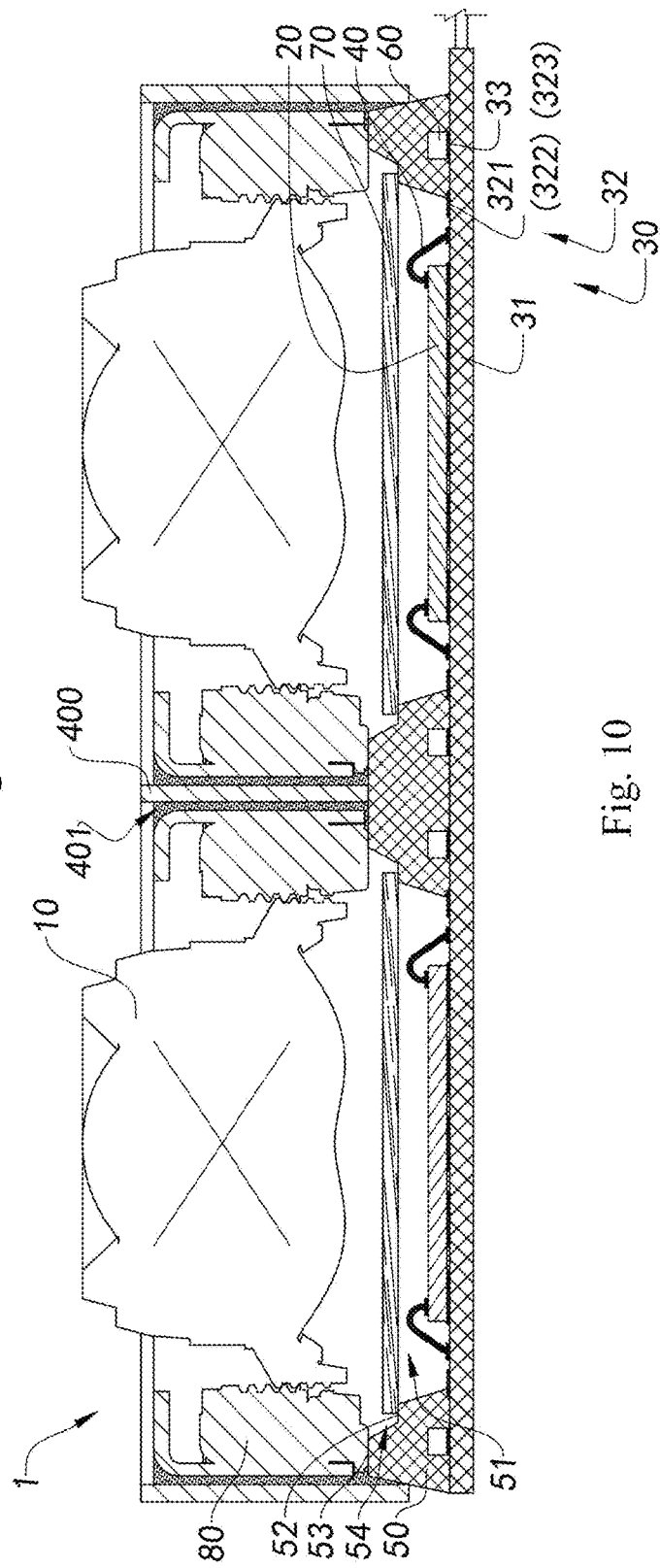
FIG. 10 is a schematic cross-sectional diagram of a manufacturing step 6 of the camera module according to the preferred embodiment of the present disclosure.

Referring to FIG. 9 and FIG. 10, the optical filtering element 70 is assembled to the inner surface 52 of the molded base 50, and the driver 80 assembled with the optical lens 10 is assembled to the outer surface 53 of the molded base 50, such that the optical lens 10 is held in the photosensitive path of the photosensitive element 20, and the optical filtering element 70 is held between the optical lens 10 and the photosensitive element 20. In addition, after the driver 80 is mounted to the mounting space 401 of the bracket 400, glue is filled between the inner wall of the bracket 400 and the outer wall of the driver 80, thus obtaining the camera module 1.

FIG. 11A to FIG. 16 show another manufacturing process of the camera module 1.

Figure 11A:
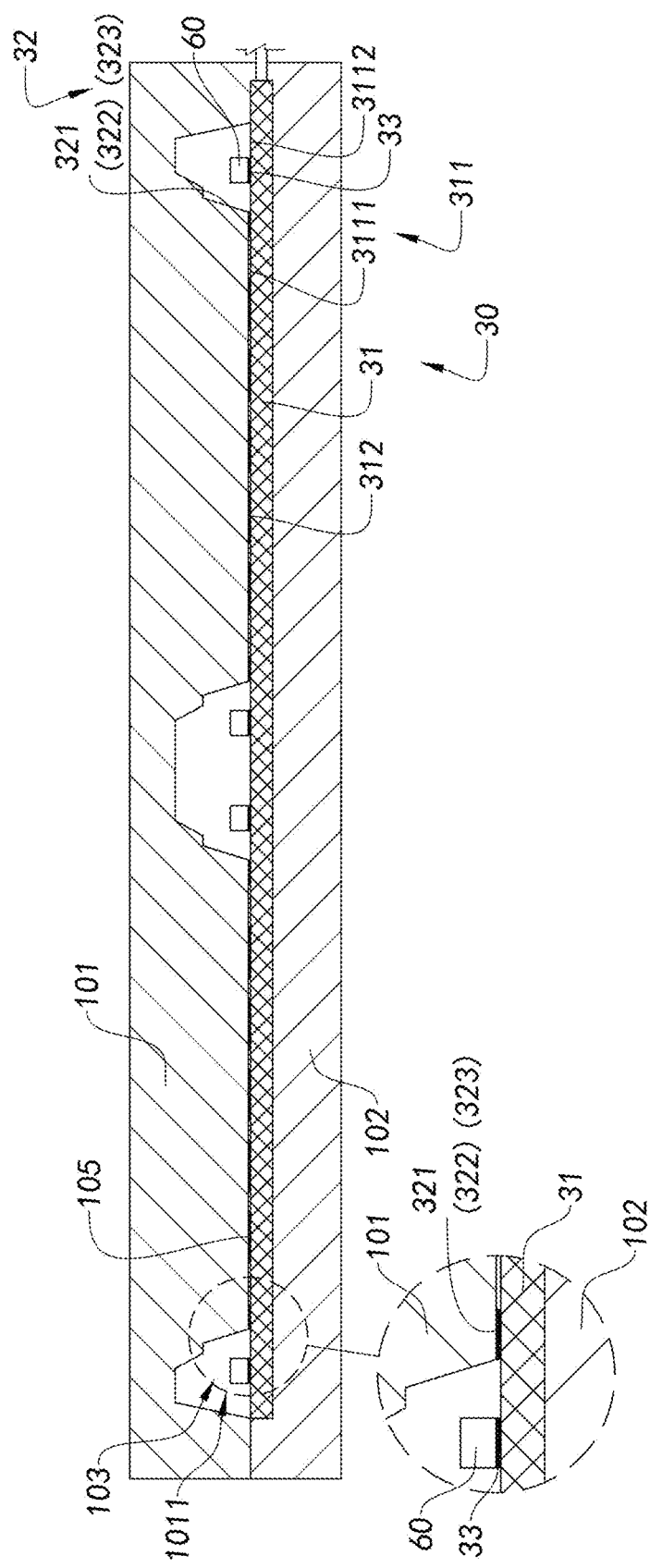
FIG. 11A is a cross-sectional view of an implementation of a manufacturing step 1 of a camera module according to another preferred embodiment of the present disclosure.
Figure 11B:
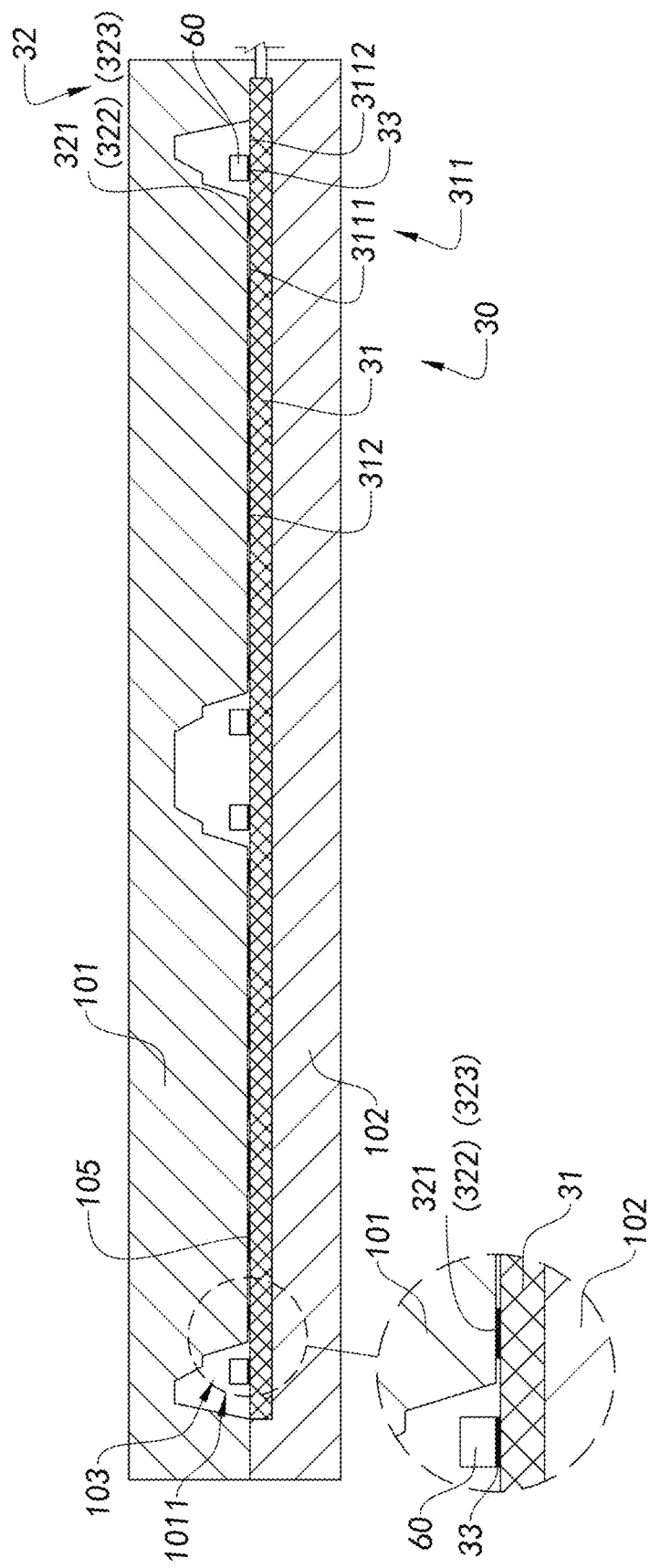
FIG. 11B is a cross-sectional view of another implementation of a manufacturing step 1 of a camera module according to another preferred embodiment of the present disclosure.
Figure 11C:
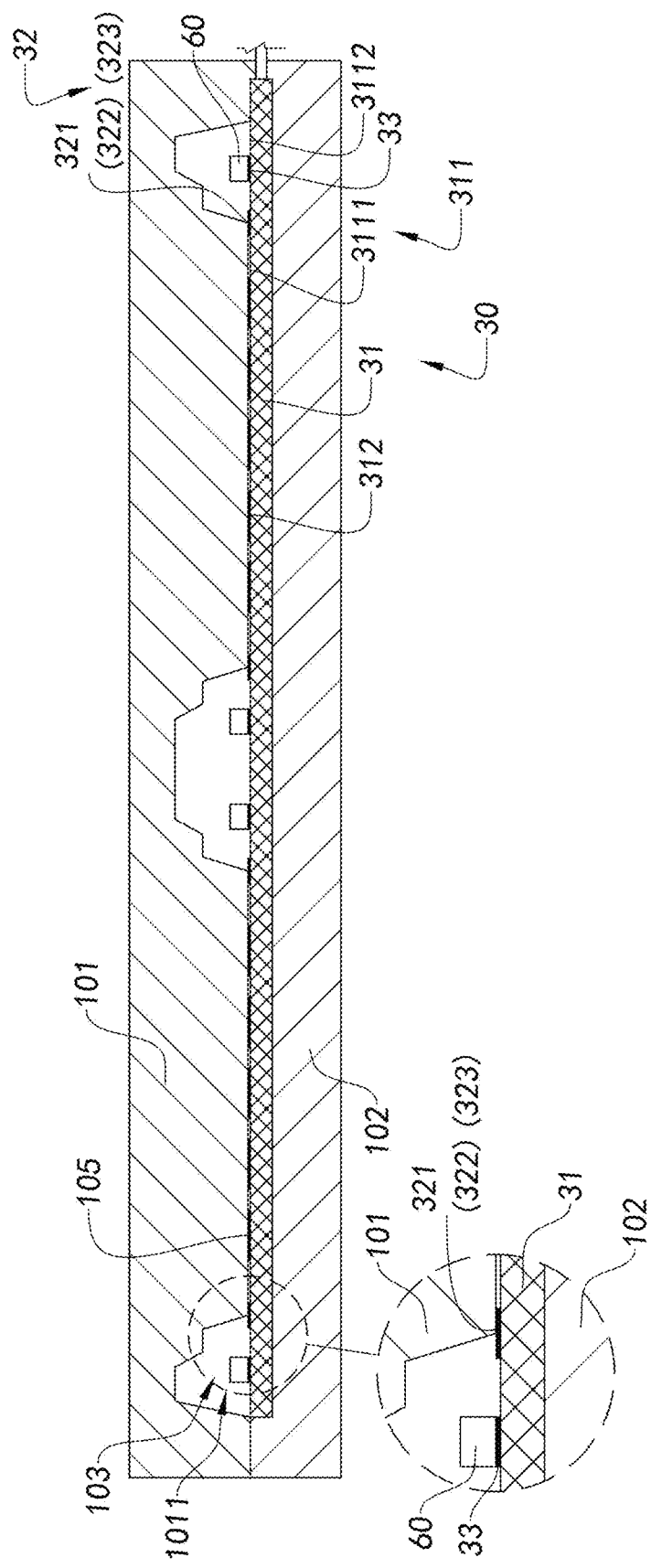
FIG. 11C is a cross-sectional view of a further implementation of a manufacturing step 1 of a camera module according to another preferred embodiment of the present disclosure.

Specifically, referring to FIG. 11A to FIG. 11C, after the electronic component 60 is mounted to the circuit board connector 33 of the circuit board 30, the circuit board 30 carrying the electronic component 60 is placed in the molding die 100. It may be appreciated that when the upper mold 101 and the lower mold 102 of the molding die 100 are clamped, the outer edge of the pressing portion 1013 of the upper mold 101 is pressed against at least a part of the ring circuit 321 of the circuit board 30. For example, in the example shown in FIG. 11A, the outer edge of the pressing portion 1013 of the upper mold 101 may be pressed against all positions of the top surface of the ring circuit 321, and the pressing portion 1013 does not protrude relative to the outer side of the ring circuit 321. In the example shown in FIG. 11B, the outer edge of the pressing portion 1013 of the upper mold 101 may be pressed against all positions of the top surface of the ring circuit 321, and the pressing portion 1013 protrudes relative to the outer side of the ring circuit 321. In the example shown in FIG. 11C, the outer edge of the pressing portion 1013 of the upper mold 101 be pressed against a part of the top surface of the ring circuit 321.

It should be appreciated by those skilled in the art that after the upper mold 101 and the lower mold 102 are clamped, the lower mold 102 seals the base molding groove 1011 of the upper mold 101, such that the base molding groove 1011 forms the base molding space 103. The edge of the circuit board 30 may correspond to the base molding space 103, such that the molded base 50 is formed at the edge of the circuit board 30 in the subsequent molding process. In another preferred example, the middle portion of the circuit board 30 may correspond to the base molding space 103, such that a part of the base molding space 103 may also be formed in the middle portion of the circuit board 30 in the subsequent molding process. It is worth mentioning that at least one of the electronic components 60 may be located in the base molding space 103 after the base molding space 103 is formed. Preferably, all of the electronic components 60 may be located in the base molding space 103, such that when the molded base 50 is formed by molding later, the molded base 50 covers all of the electronic components 60 and isolates the adjacent electronic components 60.

It may be understood that, when the upper mold 101 and the lower mold 102 are clamped, the cover film 105 overlapped on the inner surface of the upper mold 101 is located between the inner surface of the upper mold 101 and the ring circuit 321 to enhance the sealing property between the molding die 100 and the circuit board 30, and to facilitate mold release after the molding process is completed.

The cover film 105 is located between the pressing face of the pressing portion 1013 and the ring circuit 321 of the circuit board 30 to enhance the sealing property between the pressing portion 1013 and the ring circuit 321 of the circuit board 30, so that in the subsequent molding process, the molding material is prevented from flowing from the edge region 311 of the circuit board 30 to the chip mounting region 312 through the pressing portion 1013 and the ring circuit 321 of the circuit board 30, to ensure the flatness of the chip mounting region 312 and thus facilitate subsequent mounting of the photosensitive element 20.

The cover film 105 is overlapped on the inner surface, for forming the base molding groove 1011, of the upper mold 101 to facilitate mold drawing after the molded base 50 is formed at the end of the molding process. In addition, the cover film 105 is also capable of absorbing impact force of the pressing portion 1013 on the ring circuit 321 of the circuit board 30 when the upper mold 101 and the lower mold 102 are subjected to a mold operation, thereby preventing the ring circuit 321 from being damaged when the molding die 100 is clamped.

Figure 12:
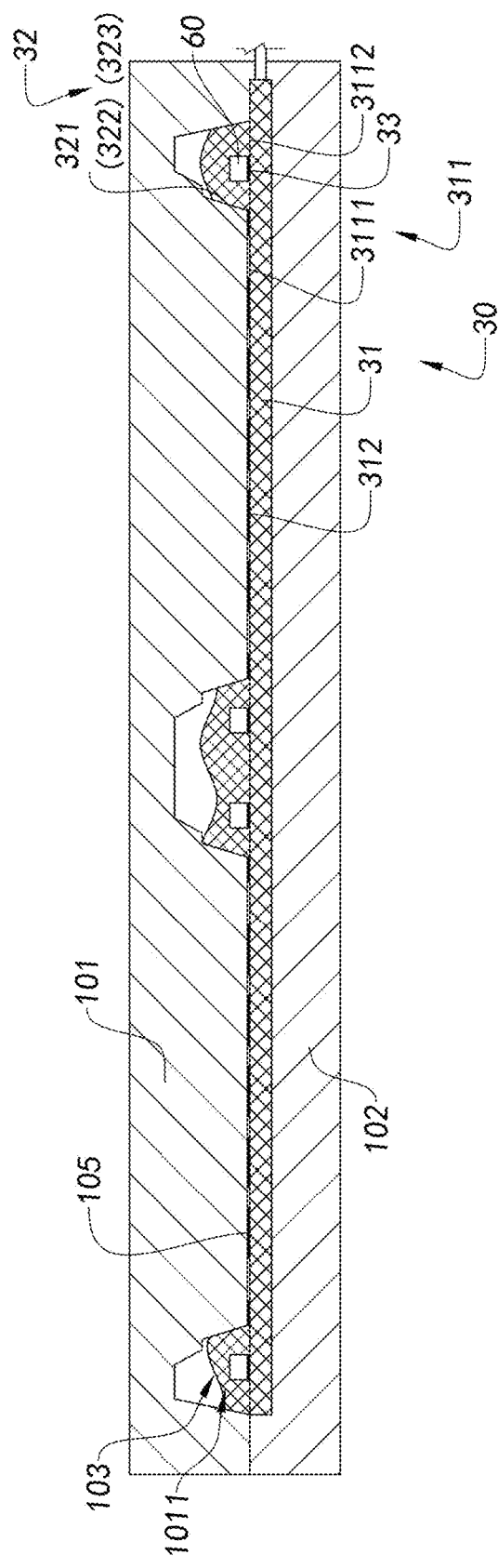
FIG. 12 is a cross-sectional view of a manufacturing step 2 of the camera module according to another preferred embodiment of the present disclosure.
Figure 13:
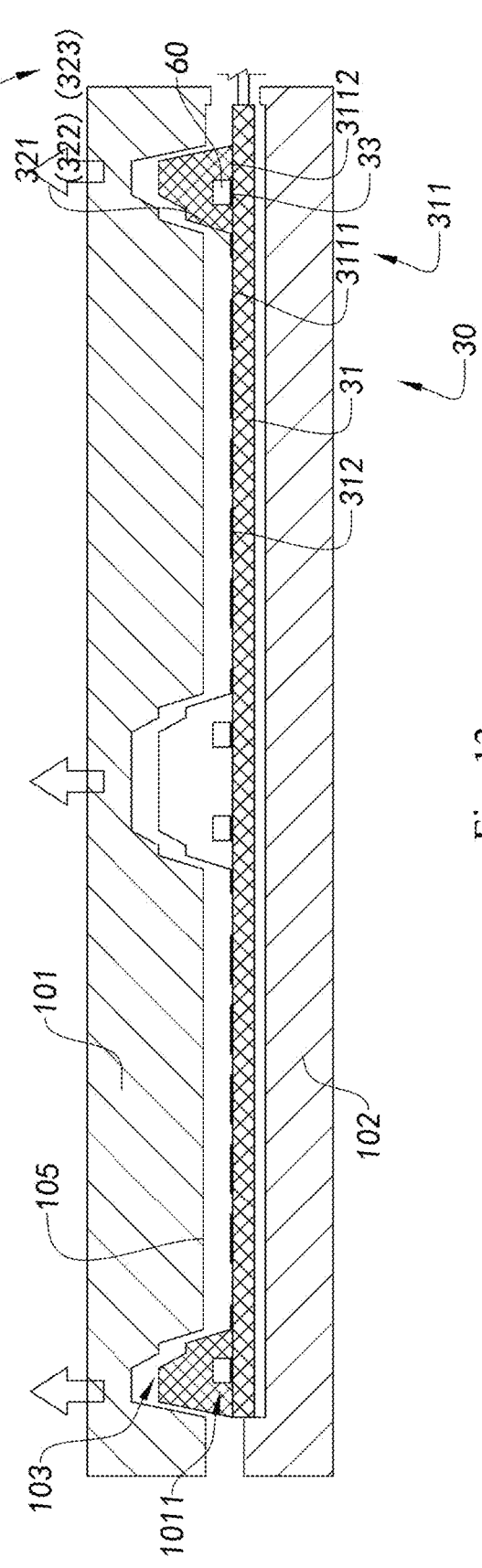
FIG. 13 is a cross-sectional view of a manufacturing step 3 of the camera module according to another preferred embodiment of the present disclosure.

Referring to FIG. 12 and FIG. 13, a fluid molding material is added into the base molding space 103. The ring circuit 321 is capable of preventing the molding material from flowing from the edge region 311 of the substrate 31 to the chip mounting region 312 through the pressing portion 1013 and the ring circuit 321 to ensure the flatness of the chip mounting region 312, and the molding material is consolidated in the base molding space 103 to form the molded base 50. The light window 51 of the molded base 50 is formed at a position corresponding to the pressing portion 1013. It may be appreciated that, after the molded base 50 is molded, the molded base 50 covers the substrate outer portion 3112 of the circuit board 30, the outer portion of the ring circuit 321 and the electronic component 60.

Figure 14:
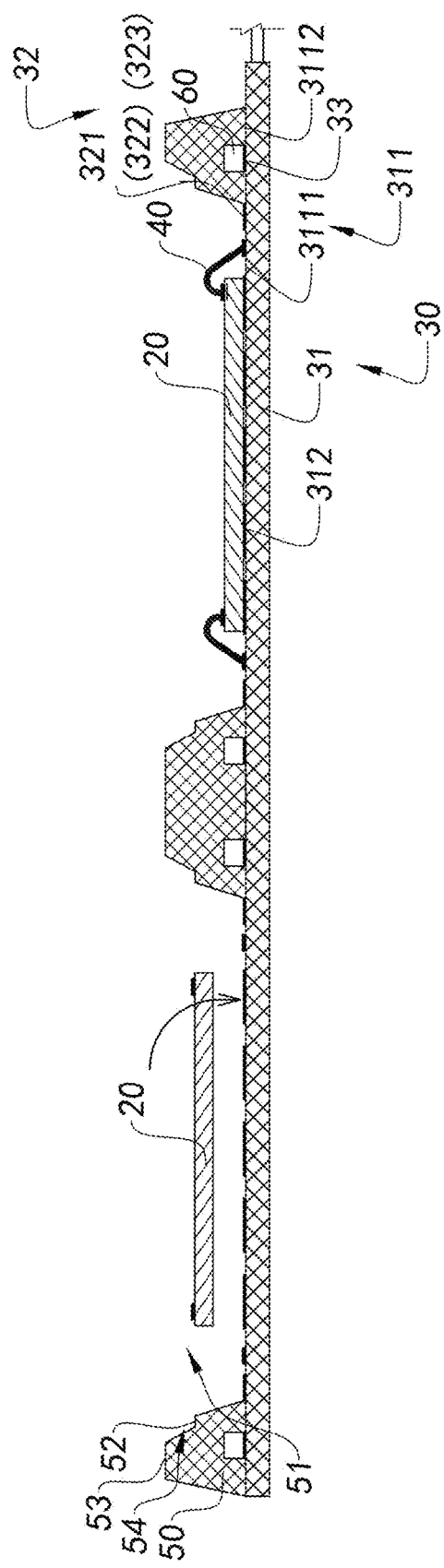
FIG. 14 is a cross-sectional view of a manufacturing step 4 of the camera module according to another preferred embodiment of the present disclosure.

In the step shown in FIG. 14, the photosensitive element 20 is mounted to the chip mounting region 312 of the circuit board 30, and the photosensitive element 20 is conductively connected to the circuit board 30 through the lead 40 to form a molded photosensitive element.

Figure 15:
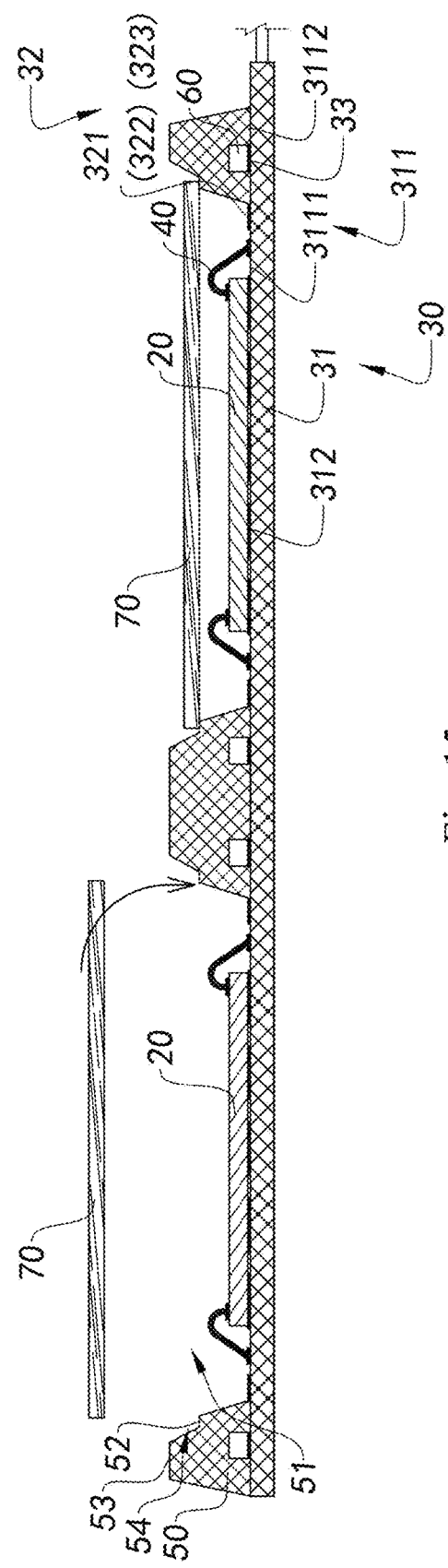
FIG. 15 is a cross-sectional view of a manufacturing step 5 of the camera module according to another preferred embodiment of the present disclosure.

Moreover, in FIG. 15, the top surface of the molded base 50 may have at least an inner surface 52 and an outer surface 53. In an example, the inner surface 52 and the outer surface 53 of the molded base 50 are in the same plane, so that the optical filtering element 70 is assembled to the inner surface 52 of the molded base 50, and the driver 80 assembled with the optical lens 10 is assembled to the outer surface 53 of the molded base 50 later.

In another example, the inner surface 52 of the molded base 50 is lower than the outer surface 53 such that a height difference exists between the inner surface 52 and the outer surface 53 to form a groove 54 of the molded base 50, where the groove 54 is connected to the light window 51. It is worth mentioning that the groove 54 of the molded base 50 and the light window 51 of the molded base 50 are formed synchronously.

Figure 16:
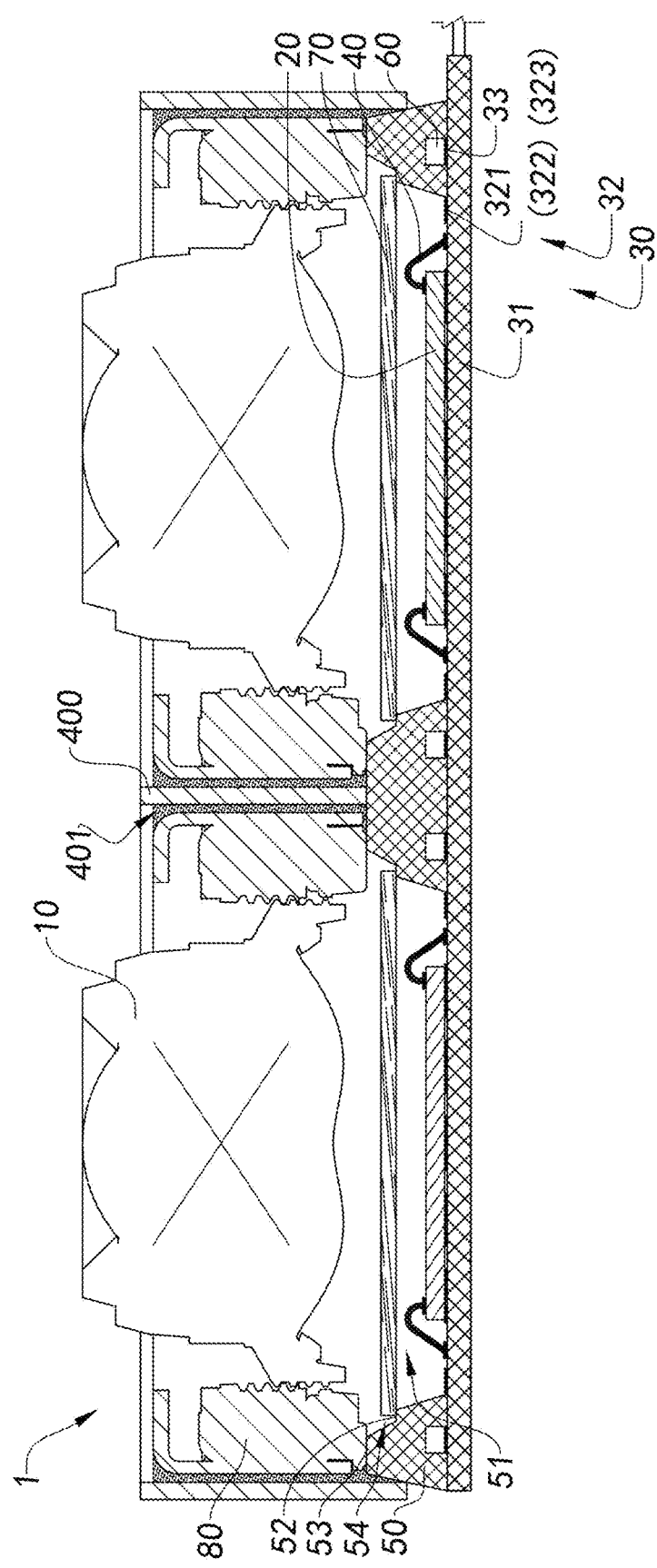
FIG. 16 is a cross-sectional view of a manufacturing step 6 of the camera module according to another preferred embodiment of the present disclosure.

Referring to FIG. 16, the optical filtering element 70 is assembled to the inner surface 52 of the molded base 50, and the driver 80 assembled with the optical lens 10 is assembled to the outer surface 53 of the molded base 50, such that the optical lens 10 is held in the photosensitive path of the photosensitive element 20, and the optical filtering element 70 is held between the optical lens 10 and the photosensitive element 20. In addition, after the driver 80 is mounted to the mounting space 401 of the bracket 400, glue is filled between the inner wall of the bracket 400 and the outer wall of the driver 80, thus obtaining the camera module 1.

According to another aspect of the present disclosure, the present disclosure further provides a manufacturing method of a circuit board 30, the manufacturing method including the following steps: (A) providing a substrate 31; and (B) forming at least one circuit section 32 at least in an edge region 311 of the substrate 31, where the circuit section 32 forms at least one annular blocking portion 322 in the edge region 311, such that after a photosensitive element 20 and the circuit board 30 are conductively connected together, the blocking portion 322 surrounds the photosensitive element 20.

According to another aspect of the present disclosure, the present disclosure further provides a manufacturing method of a molded photosensitive assembly 200, the manufacturing method including the following steps: (a) forming an annular blocking portion 322 in an edge region 311 of a substrate 31 through a circuit section 32, where the edge region 311 forms a substrate outer portion 3112 outside the blocking portion 322; (b) conductively connecting a photosensitive element 20 with the circuit section 32, where the blocking portion 322 surrounds the photosensitive element 20; (c) pressing a pressing face of a molding die 100 against the blocking portion 322 to isolate the photosensitive element 20 from the substrate outer portion 3112 of the edge region 311, where the photosensitive element 20 corresponds to a anti-pressure space 104 of the molding die 100, and the substrate outer portion 3112 corresponds to a base molding space 103 of the molding die 100; and (d) preventing, by the blocking portion 322, a fluid molding material added to the base molding space 103 from flowing from the base molding space 103 to the anti-pressure space 104, so that after the molding material is consolidated in the base molding space 103, a molded base 50 integrally incorporating a part of the substrate outer portion 3112 and a part of the blocking portion 322 and having a light window 51 is formed, where a photosensitive region of the photosensitive element 20 corresponds to the light window 51.

It is worth mentioning that step (d) may also be preformed before step (b), that is, the molded base 50 and the circuit board 30 are integrally incorporated first, then the photosensitive element 20 and the circuit section 32 are conductively connected, and the blocking portion 322 surrounds the photosensitive element 20.

In addition, referring to the left side of the top view of the circuit board 30 shown in FIG. 2, the ring circuit 321 of the circuit board 30 may form a complete ring to prevent a gap from being formed between the ring circuit 321 and the pressing face of the pressing portion 1013 when the pressing face of the pressing portion 1013 of the molding die 100 is pressed against the ring circuit 321, so that the molding material added to the base molding space 103 is prevented from entering the anti-pressure space 104 from the base molding space 103 through the ring circuit 321 and the pressing face of the pressing portion 1013, to protect the photosensitive element 20 from being contaminated and protect the lead 40 from being damaged. Therefore, undesirable phenomena such as stain spots are prevented and good electrical property of the lead 40 is ensured to further improve the yield of the camera module 1.

Referring to the right side of the top view of the circuit board 30 shown in FIG. 2, the ring circuit 321 of the circuit board 30 further includes at least one first circuit unit 3211 and at least one second circuit unit 3212. The first circuit unit 3211 extends annularly around the photosensitive element 20 in the edge region 311 of the substrate 31, but is not closed, that is, at least one opening 32110 is formed in the first circuit unit 3211. The second circuit unit 3212 is disposed at the opening 32110 of the first circuit unit 3211. That is, the second circuit unit 3212 is disposed at the unclosed position of the first circuit unit 3211 to increase the resistance to the molding material entering the anti-pressure space 104 from the base molding space 103 at the opening 32110 of the first circuit unit 3211 during molding, thereby preventing the molding material from entering the anti-pressure space 104, and protecting the photosensitive element 20 from being contaminated and damaged.

Specifically, after the fluid molding material is added to the base molding space 103, the molding material has a tendency to enter the anti-pressure space 104 from the base molding space 103 via the opening 32110 of the first circuit unit 3211, the second circuit unit 3212 is capable of rapidly decreasing the flow rate of the molding material at the opening 32110 to prevent the molding material from entering the anti-pressure space 104 from the base molding space 103 via the opening 32110 of the first circuit unit 3211.

Preferably, referring to FIG. 2 and FIG. 3, the second circuit unit 3212 is disposed in a sector shape at the opening 32110 of the first circuit unit 3211 to change the flow direction of the molding material at the opening 32110, such that the oblique flow direction of the molding material limits the vertical flow distance of the molding material. In addition, at least one slit 3213 is formed between the first circuit unit 3211 and the second circuit unit 3212, where the slit 3213 is elongated, so that the molding material is further prevented from flowing from the base molding space 103 to the anti-pressure space 104 via the slit 3213.

More specifically, the second circuit unit 3212 includes at least one extension circuit 32121, where the extension direction of each extension circuit 32121 is substantially perpendicular to the extension direction of the first circuit unit 3211, such that a slit 3213 is formed between two ends of each extension circuit 32121 and the first circuit unit 3211 respectively. Preferably, the end portion of the first circuit unit 3211 is substantially turned by 90 degrees to form a blocking circuit 32111. The extension direction of the blocking circuit 32111 is substantially the same as that of the extension circuit 32121 to form the elongated slit 3213 between the blocking circuit 32111 and the extension circuit 32121, thereby preventing the molding material from flowing from the base molding space 103 to the anti-pressure space 104 via the slit 3213.

In FIG. 2 and FIG. 3, the second circuit unit 3212 is implemented to include three extension circuits 32121. The outer ends of the extension circuits 32121 on two sides of the middle extension circuit 32121 extend obliquely away from the middle extension circuit 32121, and the slit 3213 formed between the extension circuit 32121 and the blocking circuit 32111 is bent to increase the resistance to the fluid molding material in the slit 3213, thereby preventing the molding material from flowing from the base molding space 103 to the anti-pressure space 104 via the slit 3213.

In addition, the circuit board connectors 33 are disposed at the edge region 311 of the substrate 31, and the slits 3213 correspond to the circuit board connectors 33. After the electronic components 60 are mounted to the circuit board connectors 33, the electronic components 60 are able to prevent the slits 3213 from directly connecting the substrate inner portion 3111 with the substrate outer portion 3112 of the substrate 31, and the electronic components 60 are able to prevent the molding material added to the base molding space 103 from directly entering the slits 3213 to prevent the molding material from entering the anti-pressure space 104, thereby improving the yield of the camera module 1.

Referring to FIG. 2 and FIG. 4, at least one of the first circuit unit 3211 or the second circuit unit 3212 may form a blocking protrusion 3214 to reduce the size of the slit 3213, thereby preventing the molding material from entering the anti-pressure space 104 from the base molding space 103 via the slit 3213. That is, a part of at least one of the first circuit unit 3211 or the second circuit unit 3212 is widened along the edge of the pressing portion 1013 to form the blocking protrusion 3214, thereby increasing the resistance to the molding material flowing from the base molding space 103 to the anti-pressure space 104. At the same time, the molding material is also confined in the smaller slit 3213, thereby reducing the distance and amount of the molding material entering the slit 3213 to prevent the molding material from entering the anti-pressure space 104.

It is worth mentioning that, after the camera module 1 is manufactured, the photosensitive element 20 is located in the middle of the electromagnetic field shielding portion 323 formed by the ring circuit 321, and the electromagnetic field shielding portion 323 prevents external electromagnetic force of the camera module 1 from interfering with the photosensitive element 20, and prevents the electromagnetic force generated by the photosensitive element 20 from interfering with the external environment, thus improving the imaging quality of the camera module 1.

Figure 17:
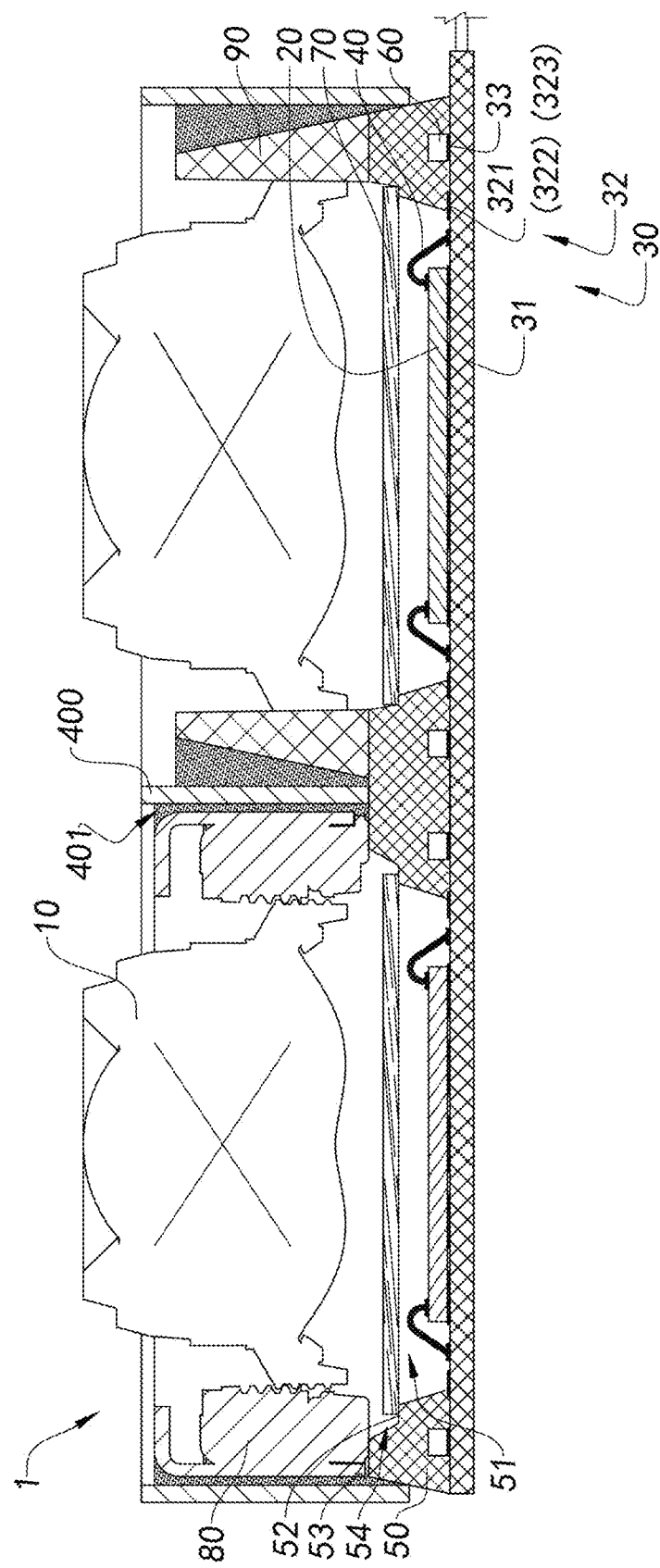
FIG. 17 is a schematic cross-sectional diagram of a first variation implementation of the camera module according to the preferred embodiment of the present disclosure.

FIG. 17 shows a first variation embodiment of the camera module 1. Unlike the above embodiment, the camera module 1 includes at least one driver 80 and at least one lens barrel 90. The driver 80 and the lens barrel 90 are respectively assembled at different positions of the top surface of the molded base 50, and each optical lens 10 is assembled to the driver 80 and the lens barrel 90 respectively, such that each of the optical lenses 10 is held in the photosensitive path of each photosensitive element 20 by means of the driver 80 and the lens barrel 90. It may be appreciated that although the lens barrel 90 shown in FIG. 17 is an unthreaded lens barrel, the lens barrel 90 may also be implemented as a threaded lens barrel 90 in other examples, so that the optical lens 10 is assembled to the lens barrel 90 by means of threaded connection.

Figure 18:
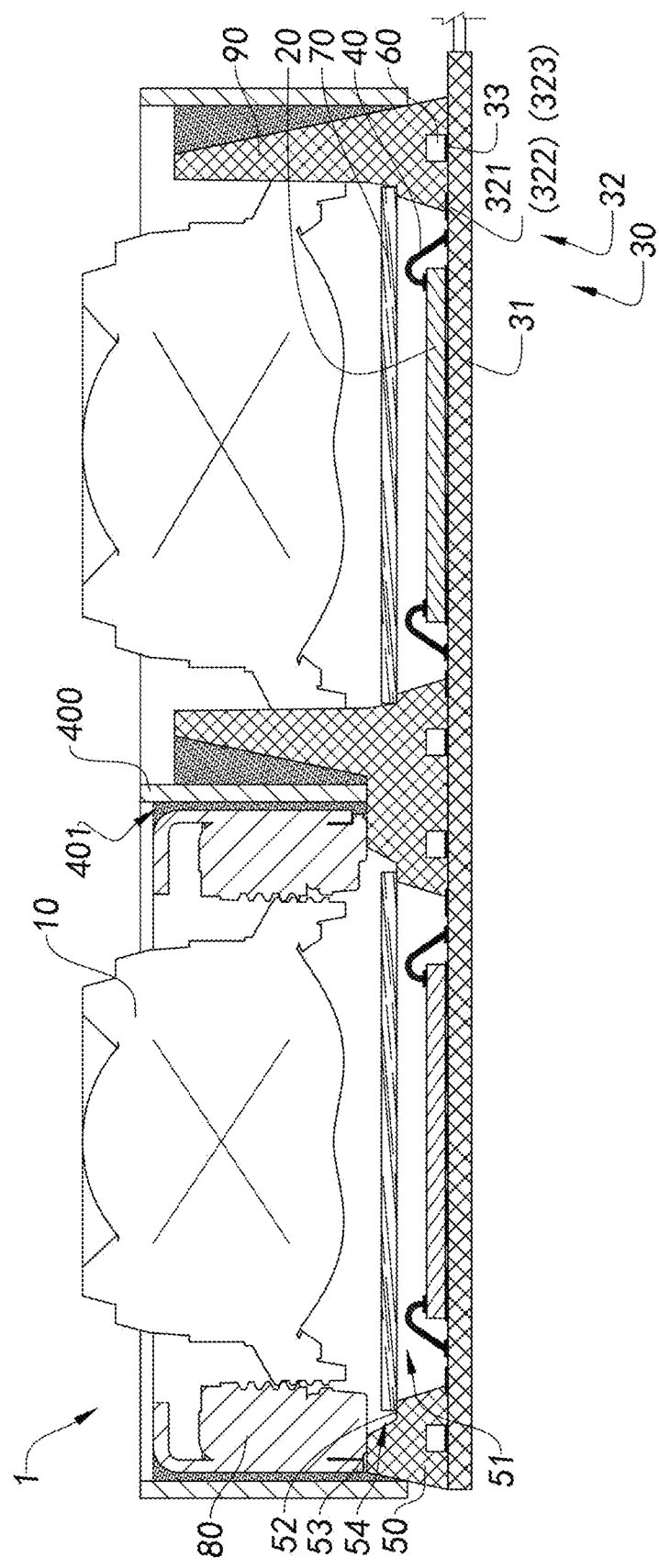
FIG. 18 is a schematic cross-sectional diagram of a second variation implementation of the camera module according to the preferred embodiment of the present disclosure.

FIG. 18 shows a second variation embodiment of the camera module 1. The lens barrel 90 integrally extends over the top surface of the molded base 50, the driver 80 is assembled to the top surface of the molded base 50, and each of the optical lenses 10 is assembled to the lens barrel 90 and the driver 80 respectively, such that each of the optical lenses 10 is held in the photosensitive path of each photosensitive element 20 by means of the driver 80 and the lens barrel 90.

Figure 19:
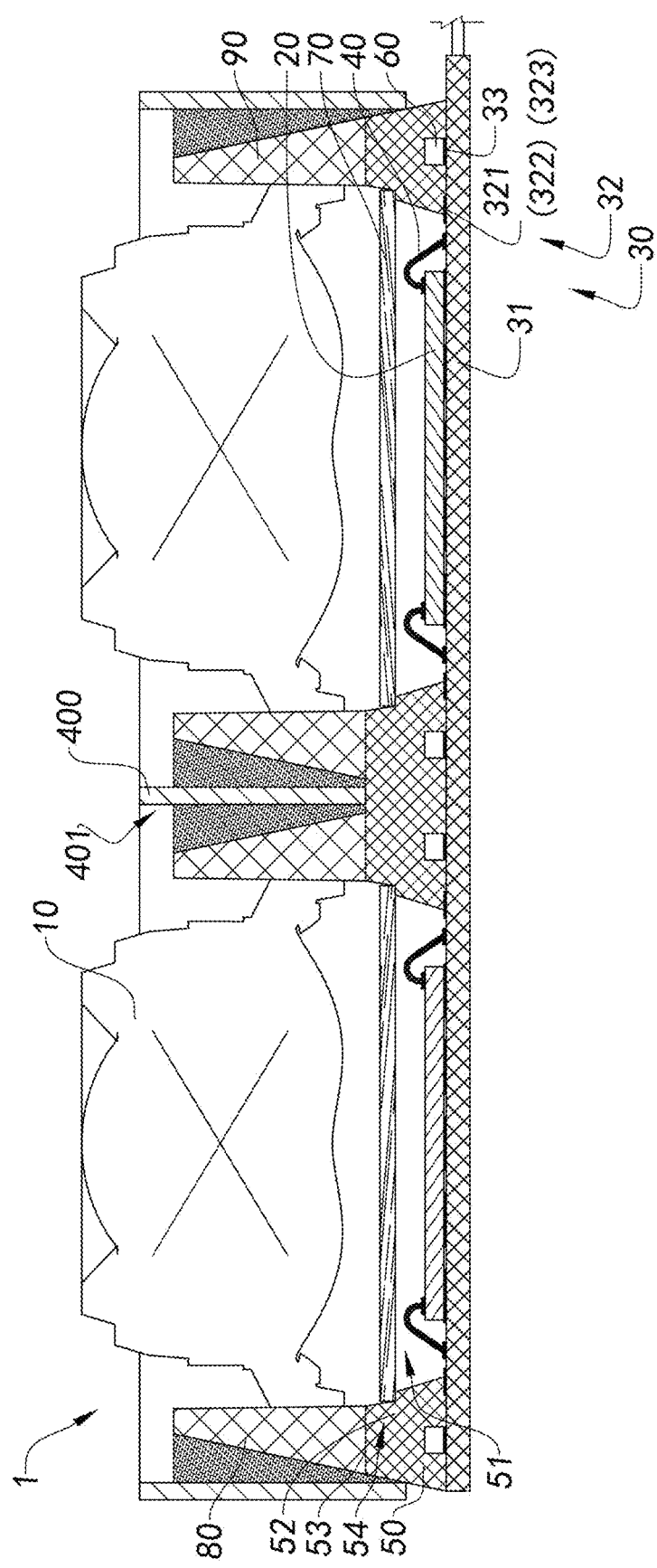
FIG. 19 is a schematic cross-sectional diagram of a third variation implementation of the camera module according to the preferred embodiment of the present disclosure.
Figure 20:
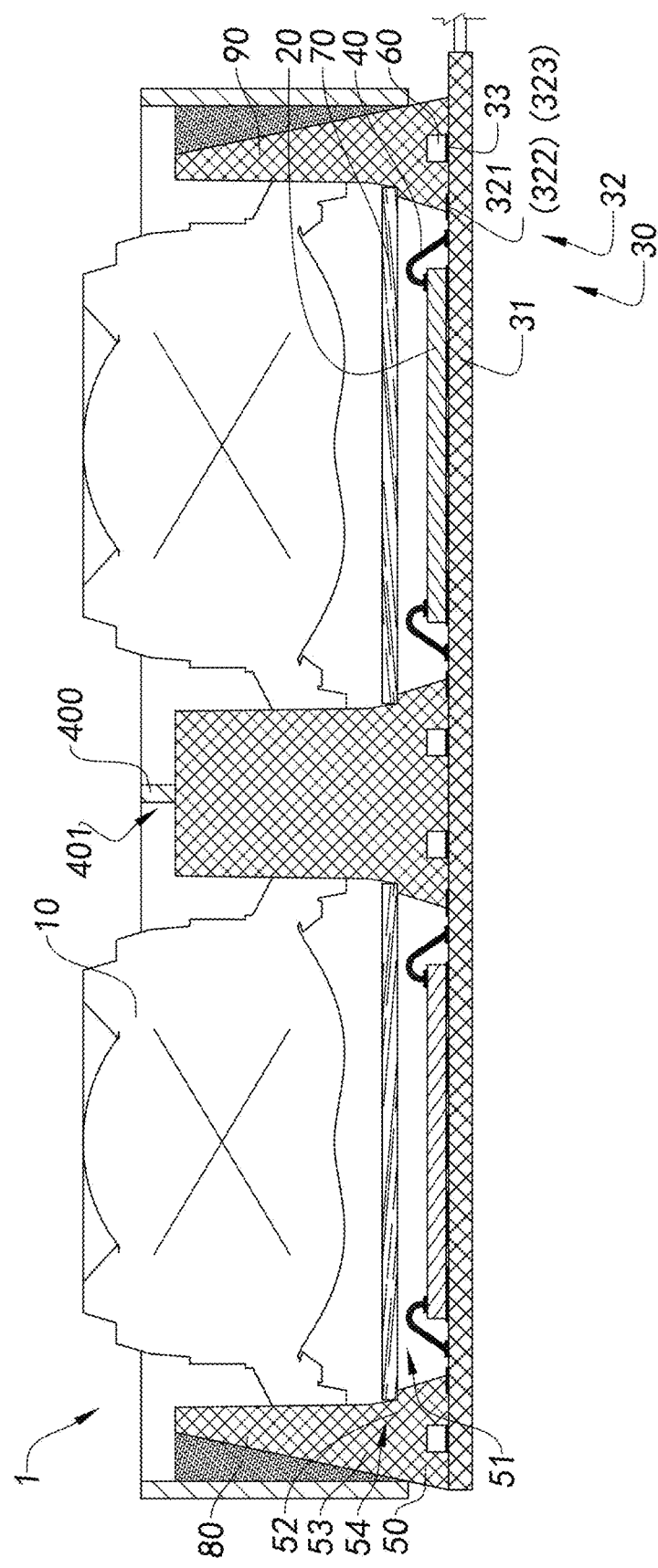
FIG. 20 is a schematic cross-sectional diagram of a fourth variation implementation of the camera module according to the preferred embodiment of the present disclosure.
Figure 21:
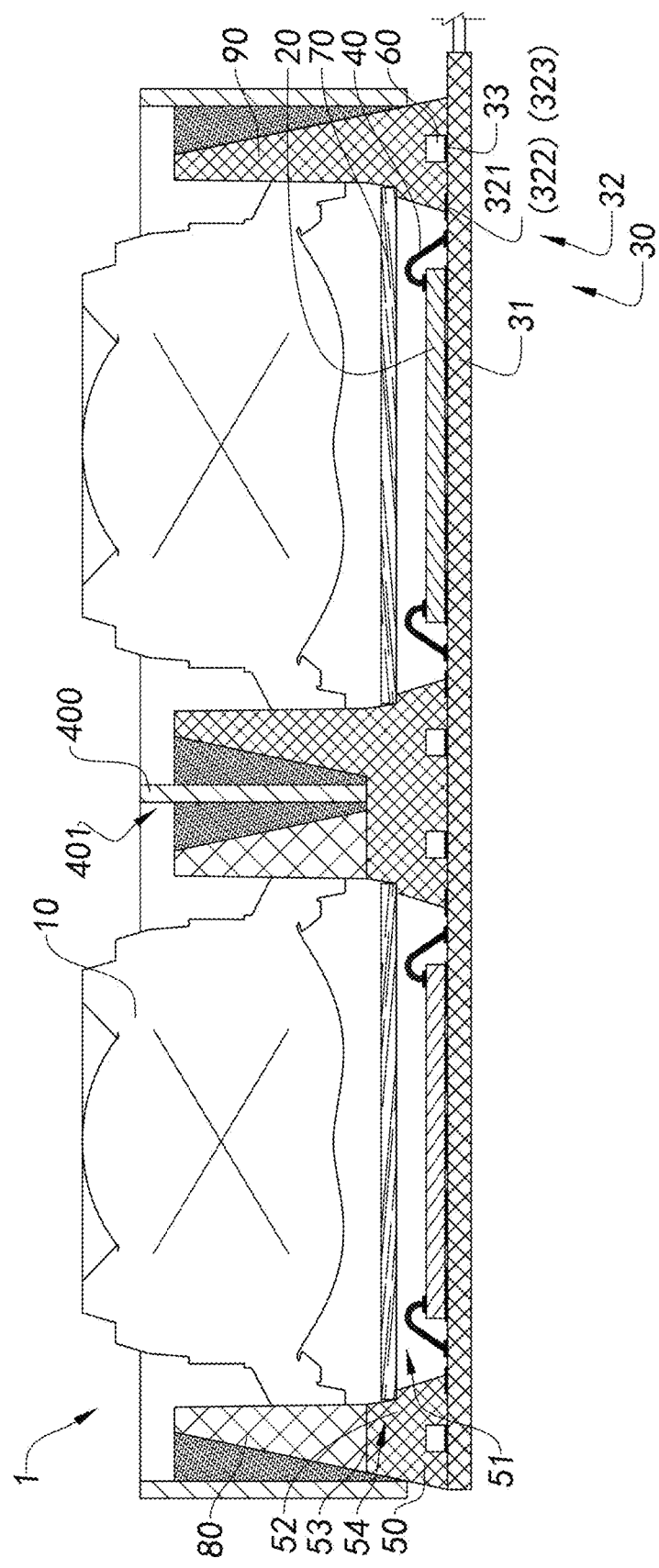
FIG. 21 is a schematic cross-sectional diagram of a fifth variation implementation of the camera module according to the preferred embodiment of the present disclosure.

FIG. 19 to FIG. 21 respectively show third, fourth and fifth variation embodiments of the camera module 1. Unlike the above embodiment, the camera module 1 is not configured with the driver 80. Specifically, the camera module 1 may include only the lens barrel 90, where the optical lens 10 is assembled to the lens barrel 90, and the lens barrel 90 is assembled to the top surface of the molded base 50 or the lens barrel 90 integrally extends over the top surface of the molded base 50, such that the optical lens 10 is held in the photosensitive path of the photosensitive element 20 by means of the lens barrel 90. For example, in the specific example shown in FIG. 19, two lens barrels 90 are respectively assembled to the top surface of the molded base 50. In the specific example shown in FIG. 20, two lens barrels 90 integrally extend over the top surface of the molded base 50. In the specific example shown in FIG. 21, one of the lens barrels 90 is assembled to the top surface of the molded base 50, and the other lens barrel 90 integrally extends over the top surface of the molded base 50. These approaches are advantageous for correcting the coaxiality of each optical lens 10 during the process of packaging the camera module 1 so as to ensure the imaging quality of the camera module 1 and improve the yield of the camera module 1.

Figure 22:
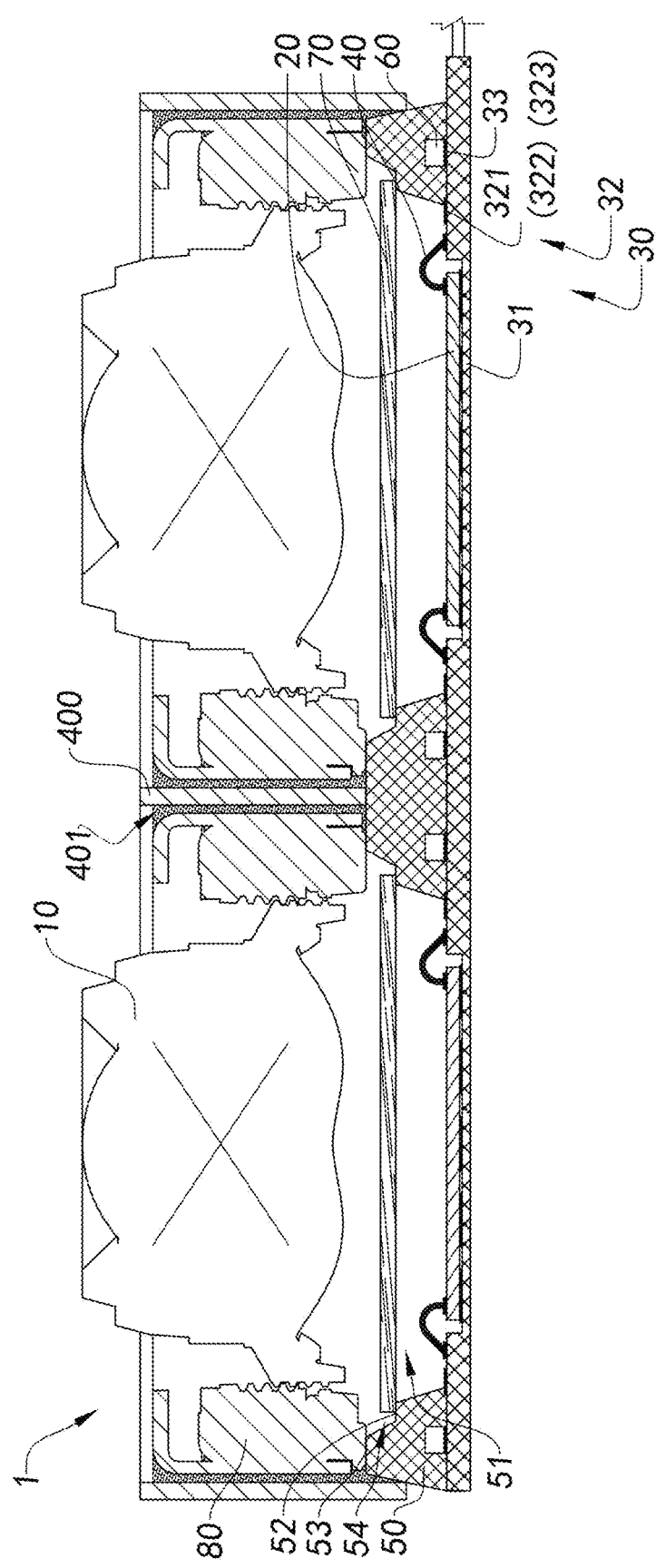
FIG. 22 is a schematic cross-sectional diagram of a sixth variation implementation of the camera module according to the preferred embodiment of the present disclosure.
Figure 23:
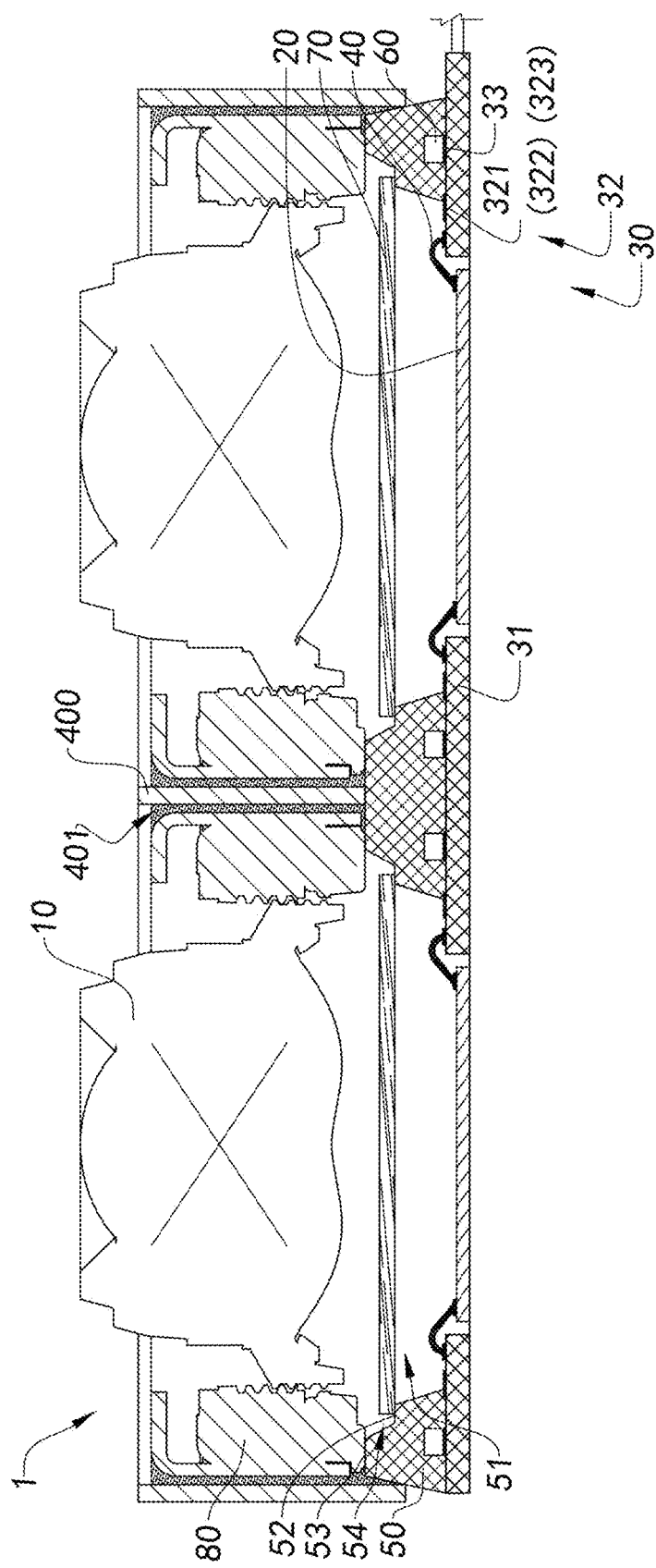
FIG. 23 is a schematic cross-sectional diagram of a seventh variation implementation of the camera module according to the preferred embodiment of the present disclosure.

FIG. 22 and FIG. 23 respectively show sixth and seventh variation embodiments of the camera module 1, where the substrate 31 of the circuit board 30 has a receiving space 313 for receiving the photosensitive element 20, thereby reducing the height difference between the top surface of the photosensitive element 20 and the top surface of the substrate 31, and even causing the top surface of the photosensitive element 20 and the top surface of the substrate 31 to be in the same plane. In this way, the height of the camera module 1 may be further reduced, so that the camera module 1 is particularly suitable for being applied to an electronic device required to be light and thin. In the specific example shown in FIG. 22, the receiving space 313 is implemented as a receiving groove, and in the specific example shown in FIG. 23, the receiving space 313 is implemented as a through hole.

Figure 24:
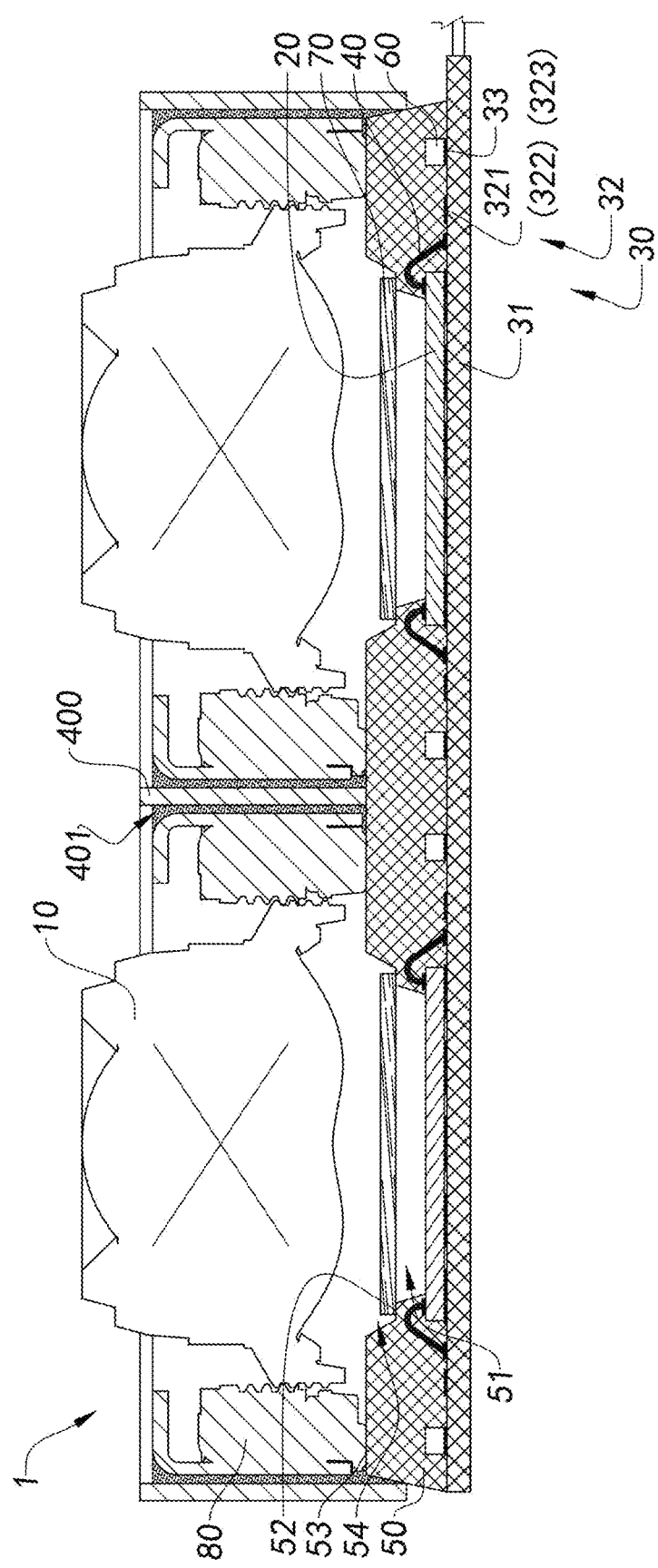
FIG. 24 is a schematic cross-sectional diagram of an eighth variation implementation of the camera module according to the preferred embodiment of the present disclosure.

FIG. 24 shows an eighth variation of the camera module 1. Unlike the camera module 1 shown in FIG. 16, in the variation embodiment of the camera module 1 shown in FIG. 24, the molded base 50 further incorporates at least a part of the non-photosensitive region of the photosensitive element 20 to further reduce the length and width of the camera module 1. Specifically, in the process of manufacturing the camera module 1, the photosensitive element 20 may be first mounted to the substrate 31 of the circuit board 30, and then a molding process is carried out, such that the molded base 50 formed in the molding process incorporates the non-photosensitive region of the photosensitive element 20. It is worth mentioning that, although the molded base 50 incorporates all of the non-photosensitive region of the photosensitive element 20 in the specific example of the camera module 1 shown in FIG. 24, the molded base 50 of the camera module 1 may also incorporate only a part of the non-photosensitive region of the photosensitive element 20 in other possible examples of the camera module 1 of the present disclosure. For example, in an embodiment implemented as a dual-lens camera module, the molded base 50 may incorporate the non-photosensitive region of one photosensitive element 20, but does not incorporate the non-photosensitive region of the other photosensitive element 20.

Figure 25:
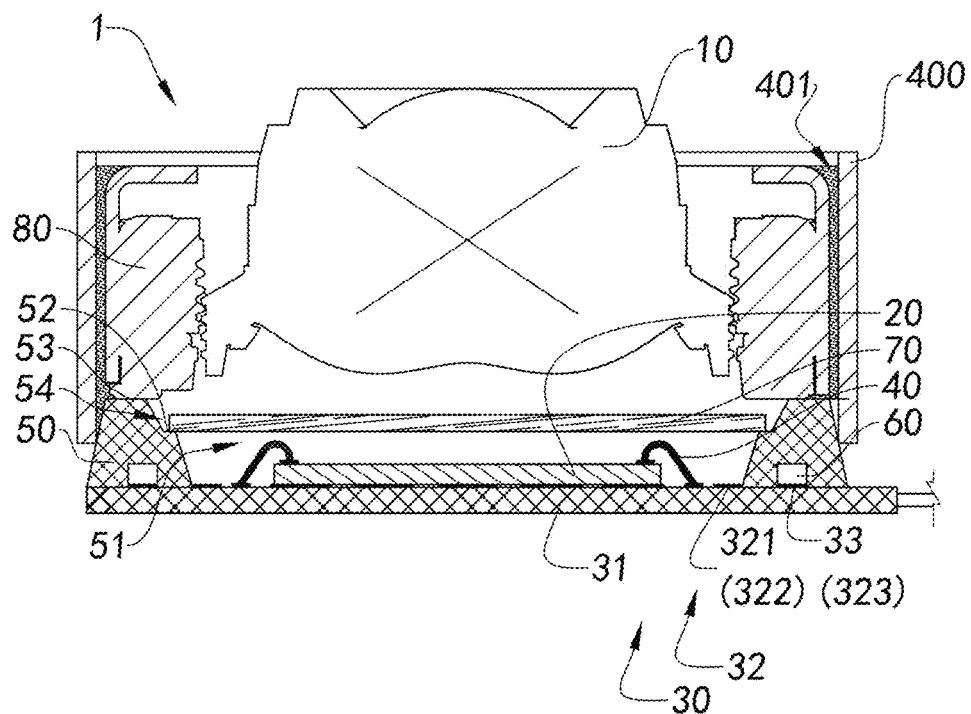
FIG. 25 is a schematic cross-sectional diagram of a ninth variation implementation of the camera module according to the preferred embodiment of the present disclosure.
Figure 26:
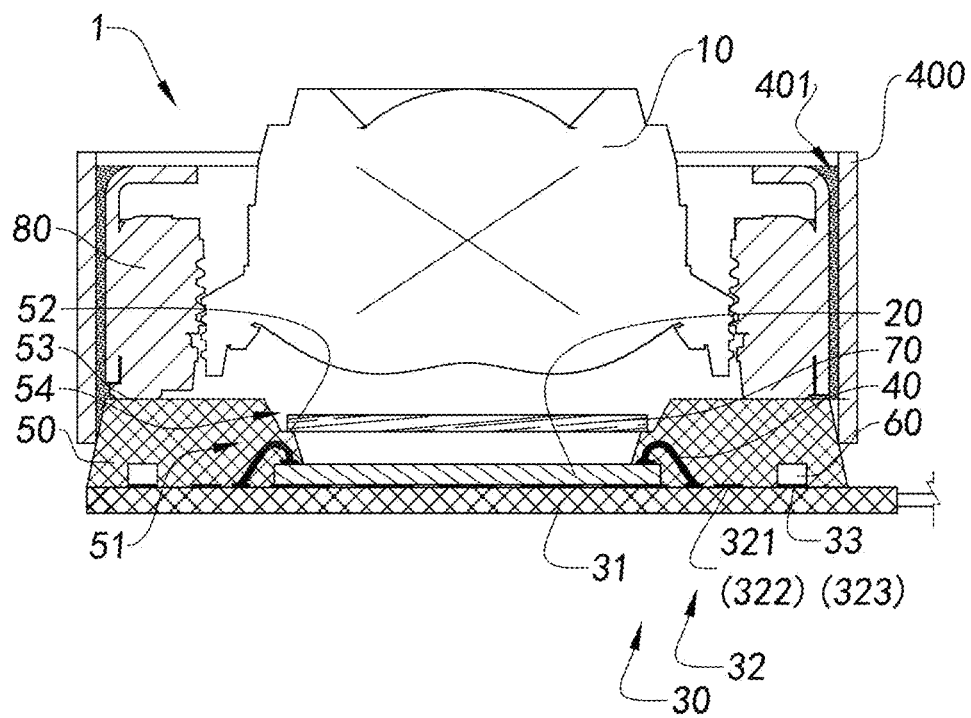
FIG. 26 is a schematic cross-sectional diagram of a tenth variation implementation of the camera module according to the preferred embodiment of the present disclosure.

FIG. 25 shows a ninth variation embodiment of the camera module 1. Different from the camera module 1 shown in FIG. 16, the camera module 1 is a single lens camera module in the variation embodiment of the camera module 1 shown in FIG. 25. FIG. 26 shows a tenth variation of the camera module 1. Unlike the camera module 1 shown in FIG. 25, the molded base 50 incorporates the non-photosensitive region of the photosensitive element 20 in the variation embodiment of the camera module 1 shown in FIG. 26.

Figure 27:
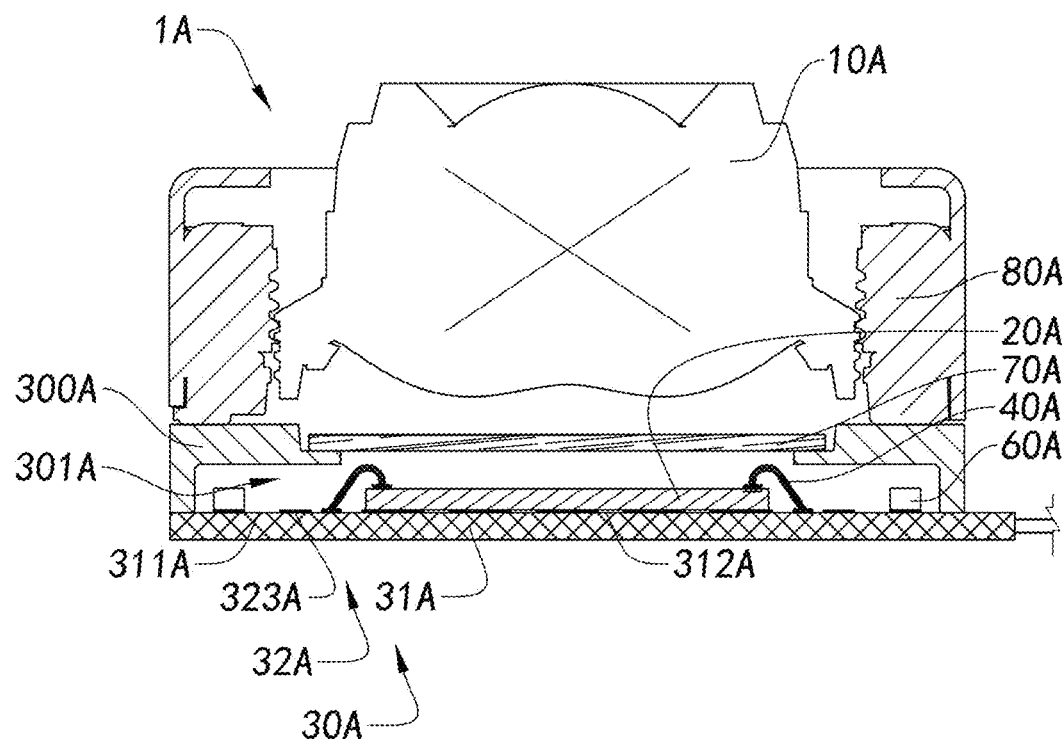
FIG. 27 is a schematic cross-sectional diagram of a camera module according to another preferred embodiment of the present disclosure.

Referring to FIG. 27, the camera module 1A according to another preferred embodiment of the present disclosure is illustrated. The camera module 1A includes at least one optical lens 10A, at least one photosensitive element 20A, and a circuit board 30A.

The circuit board 30A includes a substrate 31A and at least one circuit section 32A. The substrate 31A has an edge region 311A and at least one flat chip mounting region 312A, the edge region 311A and the chip mounting region 312A are integrally formed, and the edge region 311A surrounds the chip mounting region 312A.

The circuit section 32A is formed on the substrate 31A, and the circuit section 32A forms an annular electromagnetic field shielding portion 323A surrounding the chip mounting region 312A, in the edge region 311A of the substrate 31A. The photosensitive element 20A is mounted to the chip mounting region 312A of the circuit board 30A, and the photosensitive element 20A and the circuit section 32A of the circuit board 30A may be conductively connected through a set of leads 40A. The electromagnetic field shielding portion 323A surrounds the photosensitive element 20A to prevent external electromagnetic force from interfering with the photosensitive element 20A, thereby facilitating an improvement on the imaging quality of the camera module 1A. The optical lens 10A is disposed in a photosensitive path of the photosensitive element 20A. Light reflected by an object enters the interior of the camera module 1A from the optical lens 10A, and is subsequently received by the photosensitive element 20A and photoelectrically converted to form an image.

The camera module 1A further includes a lens holder 300A. The lens holder 300A has at least one light through hole 301A. The lens holder 300A is assembled to the edge region 311A of the circuit board 30A, and the photosensitive element 20A corresponds to the light through hole 301A of the lens holder 300A, such that the light through hole 301A provides a light path for the optical lens 10A and the photosensitive element 20A.

The camera module 1A may be implemented as a zoom camera module. Referring to FIG. 27, the camera module 1A further includes at least one driver 80A, where each driver 80A is assembled to the lens holder 300A, and each optical lens 10A is drivably provided to each driver 80A, such that the optical lens 10A is held in the photosensitive path of the photosensitive element 20A by means of the driver 80A. The driver 80A is able to drive the optical lens 10A to move along the photosensitive path of the photosensitive element 20A to adjust the focal length of the camera module 1A.

Preferably, the camera module 1A further includes at least one optical filtering element 70A. The optical filtering element 70A is disposed between the optical lens 10A and the photosensitive element 20A, so that after the light reflected by the object enters the camera module 1A from the optical lens 10A, the light may be filtered by the optical filtering element 70A, and is subsequently received by the photosensitive element 20A and photoelectrically converted to form an image.

Figure 28:
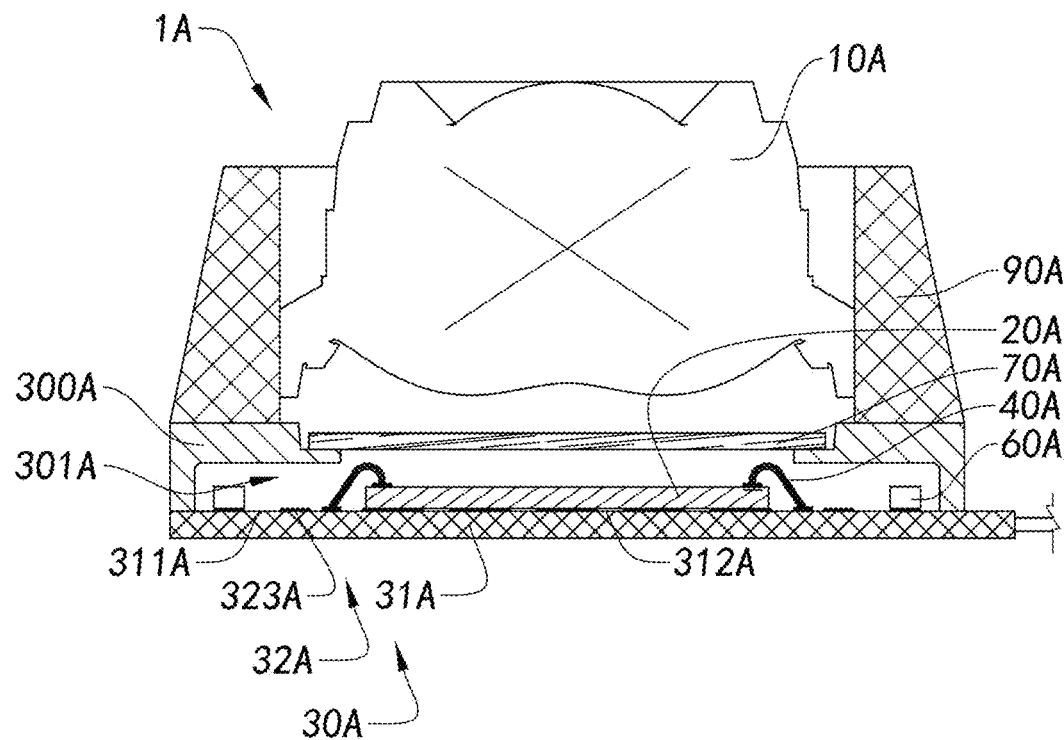
FIG. 28 is a schematic cross-sectional diagram of a variation implementation of the camera module according to the preferred embodiment of the present disclosure.

In the variation embodiment of the camera module 1A shown in FIG. 28, the camera module 1A may also be a fixed focus camera module, that is, the camera module 1A further includes at least one lens barrel 90A. The lens barrel 90A may be integrally formed with the lens holder 300A, or the lens barrel 90A is mounted to the lens holder 300A. The optical lens 10A is assembled to the lens barrel 90A, such that the optical lens 10A is held in the photosensitive path of the photosensitive element 20A by means of the lens barrel 90A.

Figure 29:
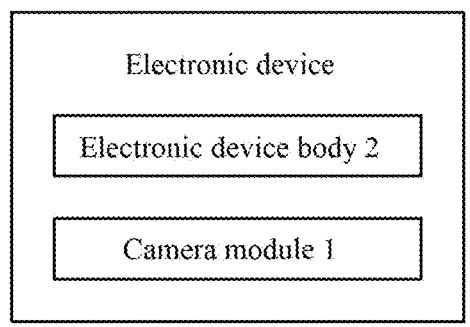
FIG. 29 is a schematic diagram of an electronic device.

FIG. 29 shows an electronic device, and the electronic device includes at least one camera module 1 and an electronic device body 2. The camera module 1 is disposed on the electronic device body 2 and configured to acquire images, and the type of the electronic device body 2 may not be limited, for example, the electronic device body 2 may be a smart phone, a tablet computer, a personal digital assistant, an MP3/4/5, an e-book, etc.

It should be understood by those skilled in the art that the embodiments of the present disclosure shown in the above description and the accompanying drawings are only examples and do not limit the present disclosure.

The objective of the present disclosure has been achieved fully and effectively. The functional and structural principles of the present disclosure have been shown and described in the embodiments. Without departing from the principles described above, the embodiments of the present disclosure may have any variations or modifications.

What is claimed is:

1. A circuit board, at least one photosensitive element being conductively connected to the circuit board, the circuit board comprising:
   a substrate, the substrate having an edge region and being provided with a set of connectors; and
   at least one circuit section, the circuit section being formed on the substrate, the photosensitive element and the circuit section being conductively connected via the connectors, the circuit section forming a ring circuit in the edge region of the substrate, and the ring circuit surrounding the photosensitive element and being located outside of the connectors.

2. The circuit board according to claim 1, wherein the substrate has at least one chip mounting region, the edge region and the chip mounting region are integrally formed, and the photosensitive element is mounted to the chip mounting region such that the ring circuit surrounds the photosensitive element.

3. The circuit board according to claim 1, wherein the substrate has at least one receiving space, the edge region surrounds the receiving space, and the photosensitive element is received in the receiving space such that the ring circuit surrounds the photosensitive element.

4. The circuit board according to claim 1, wherein the edge region of the substrate has a substrate inner portion and a substrate outer portion, and the substrate inner portion and the substrate outer portion are respectively located inside and outside the ring circuit.

5. The circuit board according to claim 1, wherein the circuit board further comprises at least one set of circuit board connectors, the circuit board connectors are disposed on the substrate, the circuit section comprises at least one set of connection circuits, and the connection circuits are connected to the ring circuit and the circuit board connectors.

6. The circuit board according to claim 1, wherein the ring circuit protrudes from a surface of the substrate.

7. A molded photosensitive assembly, comprising:
   a molded base, the molded base having at least one light window;
   at least one photosensitive element; and
   at least one circuit board, the circuit board further comprising:
   a substrate, the substrate having an edge region; and
   at least one circuit section, the circuit section being formed on the substrate, the photosensitive element and the circuit section being conductively connected, the circuit section forming a ring circuit in the edge region of the substrate, the molded base integrally incorporating a part of the edge region and a part of the ring circuit, and a photosensitive region of the photosensitive element corresponding to the light window,
   wherein the molded photosensitive assembly further comprises at least one annular blocking portion being formed on the circuit board and surrounding the photosensitive element, and
   wherein the blocking portion blocks a molding material for forming the molded base from entering a region where the photosensitive element is located from an edge region of the circuit board to form the molded base integrally incorporating with a part of the edge region of the circuit board and a part of the blocking portion after the molding material is consolidated.

8. The molded photosensitive assembly according to claim 7, wherein the edge region of the substrate has a substrate inner portion and a substrate outer portion, the substrate inner portion and the substrate outer portion are respectively located inside and outside the ring circuit, and the molded base integrally incorporates the substrate outer portion and an outer portion of the ring circuit.

9. The molded photosensitive assembly according to claim 8, further comprising at least one electronic component, wherein the circuit board comprises at least one circuit board connector, the circuit board connector is disposed at the substrate outer portion, the circuit section comprises at least one connection circuit, the connection circuit is connected to the circuit board connector and the ring circuit, the electronic component is mounted to the circuit board connector, and the molded base covers the at least one electronic component.

10. The molded photosensitive assembly according to claim 9, wherein the ring circuit is in a complete ring such that the ring circuit surrounds the photosensitive element.

11. The molded photosensitive assembly according to claim 9, wherein the ring circuit comprises at least one first circuit unit and at least one second circuit unit, the first circuit unit extends annularly around the photosensitive element, at least one opening is formed in the first circuit unit, and the second circuit unit is formed at the opening, such that at least one slit is formed between the first circuit unit and the second circuit unit.

12. The molded photosensitive assembly according to claim 9, wherein the molded base incorporates a non-photosensitive region of the photosensitive element.

13. A camera module, comprising:
   at least one optical lens;
   at least one photosensitive element;
   at least one annular blocking portion;
   at least one circuit board, the photosensitive element and the circuit board being conductively connected, the blocking portion being formed on the circuit board, the blocking portion surrounding the photosensitive element, and the optical lens being disposed in a photosensitive path of the photosensitive element; and
   a molded base, wherein the molded base has at least one light window, the blocking portion blocks a molding material for forming the molded base from entering a region where the photosensitive element is located from an edge region of the circuit board to form the molded base integrally incorporating with a part of the edge region of the circuit board and a part of the blocking portion after the molding material is consolidated, and the photosensitive element corresponds to the light window, such that the light window provides a light path for the photosensitive element and the optical lens.

14. The camera module according to claim 13, wherein the circuit board comprises a substrate and at least one circuit section formed on the substrate, the circuit section forms a ring circuit in an edge region of the substrate of the circuit board, and the ring circuit forms the blocking portion.

15. The camera module according to claim 13, wherein the circuit board comprises a substrate and at least one circuit section formed on the substrate, the circuit section forms an annular electromagnetic field shielding portion in an edge region of the substrate of the circuit board to prevent external electromagnetic force from interfering with the photosensitive element, and the electromagnetic field shielding portion forms the blocking portion.

16. The camera module according to claim 14, wherein the edge region of the substrate has a substrate inner portion and a substrate outer portion, the substrate inner portion and the substrate outer portion are respectively on two sides of the ring circuit, and the molded base integrally incorporates the substrate outer portion and an outer portion of the ring circuit.

17. The camera module according to claim 16, further comprising at least one electronic component, wherein the electronic component is disposed on the substrate outer portion, and the molded base covers the electronic component.

18. The camera module according to claim 13, further comprising at least one optical filtering element, wherein the optical filtering element is held between the optical lens and the photosensitive element.

19. The camera module according to claim 13, wherein the molded base incorporates a non-photosensitive region of the photosensitive element.

* * * * *